(12) United States Patent
Lee et al.

(10) Patent No.: US 11,723,290 B2
(45) Date of Patent: Aug. 8, 2023

(54) SEMICONDUCTOR DEVICE INCLUDING DATA STORAGE STRUCTURE

(71) Applicant: SAMSUNG ELECTRONICS CO., LTD., Suwon-si (KR)

(72) Inventors: Kyung Hwan Lee, Suwon-si (KR); Yong Seok Kim, Suwon-si (KR); Tae Hun Kim, Suwon-si (KR); Seok Han Park, Suwon-si (KR); Satoru Yamada, Suwon-si (KR); Jae Ho Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/514,086

(22) Filed: Oct. 29, 2021

(65) Prior Publication Data
US 2022/0052257 A1    Feb. 17, 2022

Related U.S. Application Data

(63) Continuation of application No. 16/592,041, filed on Oct. 3, 2019, now Pat. No. 11,165,018.

(30) Foreign Application Priority Data

Sep. 6, 2019  (KR) .......................... 10-2019-0110620

(51) Int. Cl.
  *H10N 70/20*   (2023.01)
  *H10B 63/00*   (2023.01)
  *H10N 70/00*   (2023.01)

(52) U.S. Cl.
  CPC ............. *H10N 70/24* (2023.02); *H10B 63/34* (2023.02); *H10N 70/023* (2023.02);
  (Continued)

(58) Field of Classification Search
  CPC .............. H01L 45/1226; H01L 45/146; H01L 45/1616; H01L 45/1223; H01L 45/145;
  (Continued)

(56) References Cited

U.S. PATENT DOCUMENTS

7,742,331 B2    6/2010   Watanabe
8,427,865 B2    4/2013   Shima et al.
(Continued)

FOREIGN PATENT DOCUMENTS

KR    10-1536511 B1    7/2015

OTHER PUBLICATIONS

S. Stathopoulos, "Multibit memory operation of metal-oxide bi-layer memristors", University of Southampton, Department of Electronics and Computer Science.
(Continued)

*Primary Examiner* — Thinh T Nguyen
(74) *Attorney, Agent, or Firm* — Lee IP Law, P.C.

(57) ABSTRACT

A semiconductor device includes a stack structure on a substrate, the stack structure including alternating gate electrodes and insulating layers stacked along a first direction, a vertical opening through the stack structure along the first direction, the vertical opening including a channel structure having a semiconductor layer on an inner sidewall of the vertical opening, and a variable resistive material on the semiconductor layer, a vacancy concentration in the variable resistive material varies along its width to have a higher concentration closer to a center of the channel structure than to the semiconductor layer, and an impurity region on the substrate, the semiconductor layer contacting the impurity region at a bottom of the channel structure.

18 Claims, 30 Drawing Sheets

(52) U.S. Cl.
CPC ......... *H10N 70/231* (2023.02); *H10N 70/826* (2023.02); *H10N 70/8833* (2023.02)

(58) Field of Classification Search
CPC ..... H01L 45/08; H01L 27/2424; H10N 70/24; H10N 70/826; H10N 70/231; H10N 70/023; H10N 70/823
USPC .............................................. 257/4; 438/216
See application file for complete search history.

(56) References Cited

U.S. PATENT DOCUMENTS

| | | | |
|---|---|---|---|
| 8,953,361 | B2 | 2/2015 | Park |
| 9,048,421 | B2 | 6/2015 | Seong et al. |
| 9,059,395 | B2 | 6/2015 | Ju et al. |
| 9,076,958 | B2 | 7/2015 | Ahn |
| 9,093,369 | B2 | 7/2015 | Shin et al. |
| 9,183,893 | B2 | 11/2015 | Kanamori et al. |
| 9,293,510 | B1 | 3/2016 | Park |
| 9,391,274 | B2 | 7/2016 | Kim et al. |
| 9,634,246 | B2 | 4/2017 | Lee |
| 9,666,642 | B2 | 5/2017 | Park |
| 9,685,321 | B2 | 6/2017 | Terai et al. |
| 9,947,685 | B2 | 4/2018 | Fujii et al. |
| 2013/0228739 | A1* | 9/2013 | Sasago et al. .......... H01L 45/04 257/4 |
| 2015/0255511 | A1 | 9/2015 | Takagi et al. |
| 2016/0071861 | A1 | 3/2016 | Serov et al. |
| 2017/0092355 | A1 | 3/2017 | Kurotsuchi et al. |
| 2018/0006054 | A1 | 1/2018 | Liu et al. |
| 2018/0019318 | A1 | 1/2018 | An et al. |
| 2018/0233512 | A1 | 8/2018 | Van Houdt et al. |

OTHER PUBLICATIONS

S. Kim, et al., "A Phase Change Memory Cell with Metallic Surfactant Layer as a Resistance Drift Stabilizer," IEEE, 2013.

* cited by examiner

SEMICONDUCTOR DEVICE INCLUDING DATA STORAGE STRUCTURE

CROSS-REFERENCE TO RELATED APPLICATION

This is a continuation of U.S. patent application Ser. No. 16/592,041 filed Oct. 3, 2019, which is incorporated by reference herein in its entirety.

Korean Patent Application No. 10-2019-0110620, filed on Sep. 6, 2019, in the Korean Intellectual Property Office, and entitled: "Semiconductor Device Including Data Storage Structure," is incorporated by reference herein in its entirety.

BACKGROUND

1. Field

Example embodiments relate to a semiconductor device, and more particularly, to a semiconductor device including a data storage structure and a method of manufacturing the same.

2. Description of the Related Art

Demand for improving integration density of a semiconductor device has increased to improve price competitiveness of electronic products. To improve integration density of a semiconductor device, a semiconductor device, in which memory cells are arranged three-dimensionally, has been suggested instead of a semiconductor device including memory cells arranged two-dimensionally. As memory cells are arranged three-dimensionally, however, distribution properties of memory cells may degrade.

SUMMARY

According to an aspect of embodiments, a semiconductor device may include a stack structure on a substrate, the stack structure including alternating gate electrodes and insulating layers stacked along a first direction, a vertical opening through the stack structure along the first direction, the vertical opening including a channel structure having a semiconductor layer on an inner sidewall of the vertical opening, and a variable resistive material on the semiconductor layer, a vacancy concentration in the variable resistive material varies along its width to have a higher concentration closer to a center of the channel structure than to the semiconductor layer, and an impurity region on the substrate, the semiconductor layer contacting the impurity region at a bottom of the channel structure.

According to another aspect of embodiments, a semiconductor device may include a stack structure on a substrate, the stack structure including alternating gate electrodes and insulating layers stacked along a first direction, a vertical opening through the stack structure along the first direction, the vertical opening including a channel structure having a semiconductor layer on an inner sidewall of the vertical opening, a variable resistive material on the semiconductor layer, and a buffer layer between the first variable resistive material and the semiconductor layer, an entirety of the buffer layer including a material having a structure with smaller grains than the semiconductor layer, and an impurity region on the substrate, the semiconductor layer contacting the impurity region at a bottom of the channel structure.

According to yet another aspect of embodiments, a semiconductor device may include a stack structure on a substrate, the stack structure including alternating gate electrodes and insulating layers stacked along a first direction, a vertical opening through the stack structure along the first direction, the vertical opening including a channel structure having a polysilicon semiconductor layer on an inner sidewall of the vertical opening, a variable resistive material on the semiconductor layer, and an amorphous silicon buffer layer between the first variable resistive material and the semiconductor layer, and an impurity region on the substrate, the semiconductor layer contacting the impurity region at a bottom of the channel structure.

BRIEF DESCRIPTION OF DRAWINGS

Features will become apparent to those of skill in the art by describing in detail exemplary embodiments with reference to the attached drawings, in which.

DETAILED DESCRIPTION

Hereinafter, embodiments will be described as follows with reference to the accompanying drawings.

Figure 1:
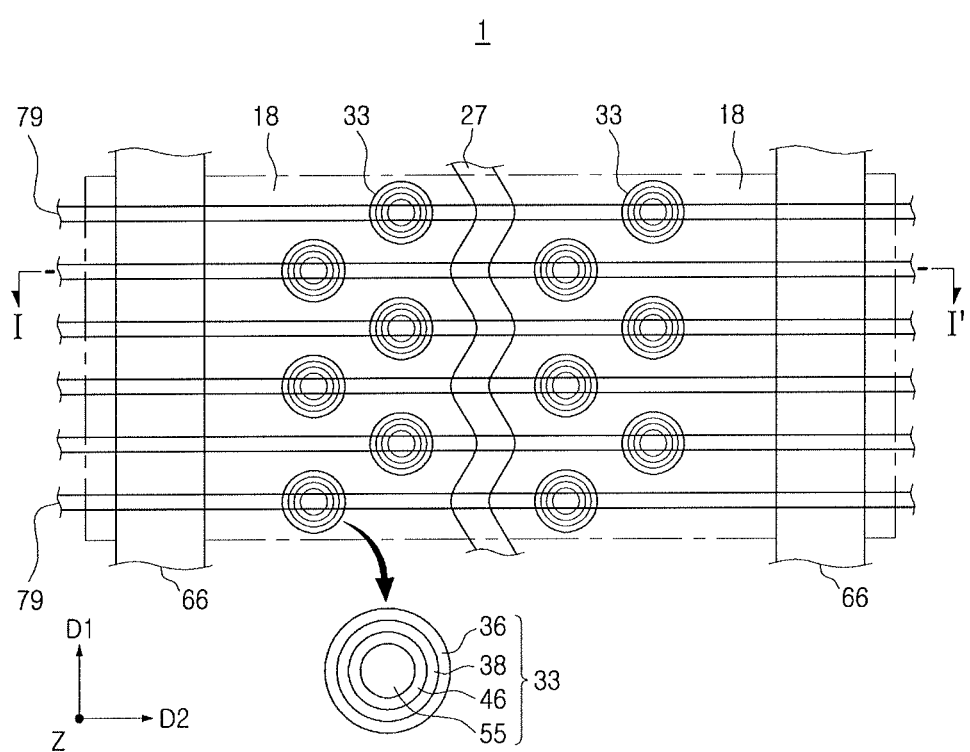
FIG. 1 illustrates a plan diagram of a semiconductor device according to an example embodiment.

In the description below, a semiconductor device will be described in accordance with example embodiments with reference to FIG. 1. FIG. 1 is a plan diagram illustrating portions of elements of a semiconductor device according to an example embodiment.

Referring to FIG. 1, a semiconductor device 1 in the example embodiment may include a stack structure 18, separation structures 66 penetrating through the stack structure 18, a vertical structure 33 between the separation structures 66, and conductive lines 79. The separation structures 66 may extend in a first direction D1, and may be spaced apart from each other in a second direction D2 perpendicular to the first direction D1. The conductive lines 79 may extend in the second direction D2, and may be spaced apart from each other in the first direction D1.

The vertical structure 33 may be disposed in the stack structure 18, e.g., the vertical structure 33 penetrates through the stack structure 18. The vertical structure 33 may include a core region 55, a data storage structure 46 surrounding a side surface of the core region 55, a channel semiconductor layer 38 surrounding an external side surface of the data storage structure 46, and a gate dielectric layer 36 surrounding an external side surface of the channel semiconductor layer 38. For example, as illustrated in FIG. 1, each of the data storage structure 46, the channel semiconductor layer 38, and the gate dielectric layer 36 surrounds an entire perimeter of the core region 55, as viewed in a top view. The vertical structure 33 may include a channel structure. The channel structure may include the gate dielectric layer 36, the channel semiconductor layer 38, the data storage structure 46 and the core region 55. The channel semiconductor layer 38 may be referred to as a 'semiconductor layer'.

In an example embodiment, the data storage structure 46 may include a variable resistive material. In another example embodiment, the data storage structure 46 may include a phase change material. In the description below, one or more example embodiments of a semiconductor device 1 will be described.

Figure 2A:
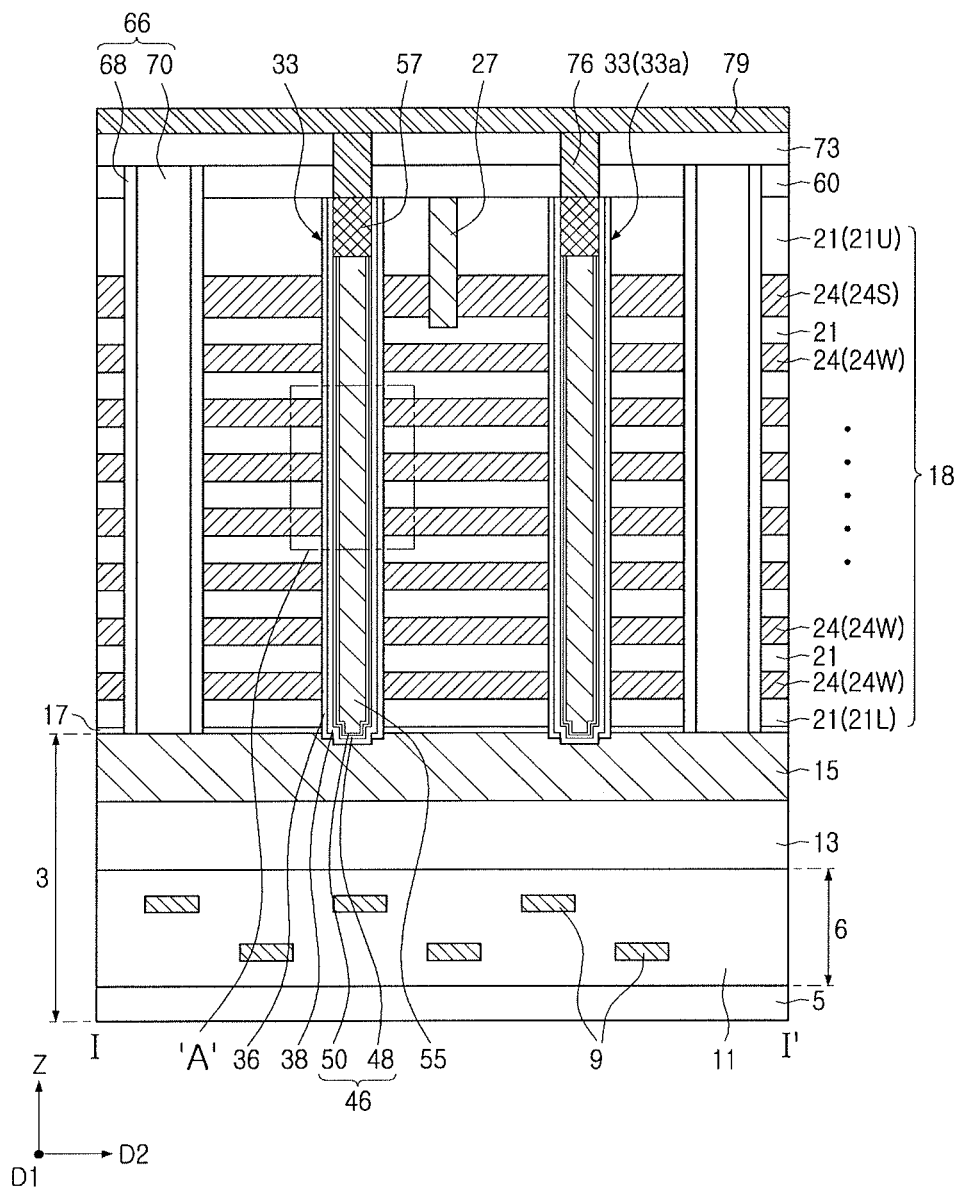
FIG. 2A illustrates a cross-sectional view along line I-I' in FIG. 1.
Figure 2B:
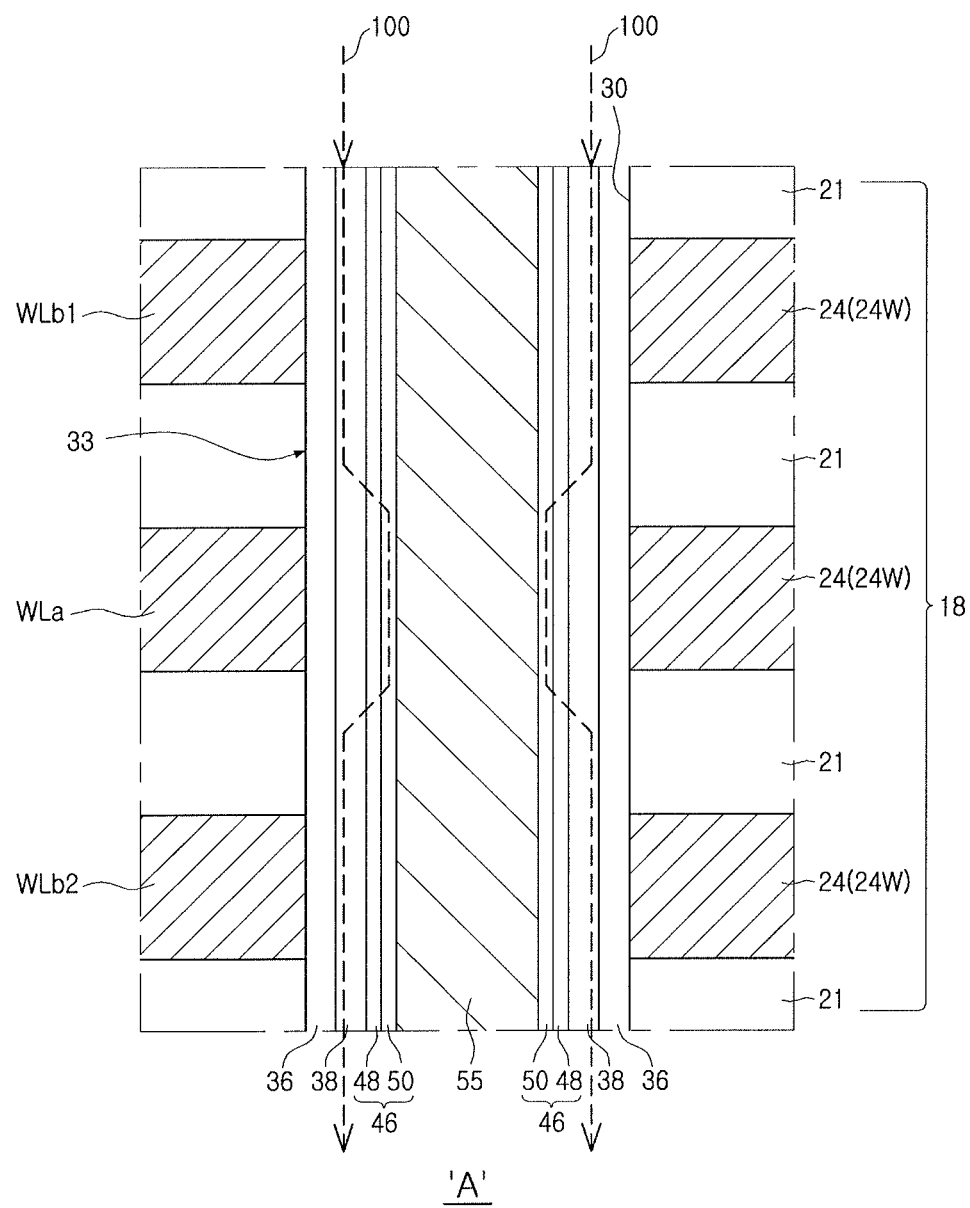
FIG. 2B illustrates an enlarged view of portion 'A' in FIG. 2A.

A semiconductor device will be described in accordance with an example embodiment with reference to FIGS. 2A and 2B. FIG. 2A is a cross-sectional diagram illustrating a region of a semiconductor device taken along line I-I' in FIG. 1. FIG. 2B is an enlarged diagram illustrating portion A in FIG. 2A.

Referring to FIGS. 1, 2A, and 2B, the stack structure 18 may be disposed on a lower structure 3. In an example embodiment, the lower structure 3 may include an impurity region 15. The impurity region 15 may be formed of, e.g., polysilicon having N-type conductivity.

In an example embodiment, the lower structure 3 may include a lower base 5, a peripheral circuit region 6 disposed on the lower base 5, an upper base 13 disposed on the peripheral circuit region 6, and the impurity region 15 disposed on the upper base 13. The lower base 5 may be implemented as a semiconductor substrate formed of a semiconductor material, e.g., silicon. The lower base 5 may be a single crystal silicon substrate. The peripheral circuit region 6 may include peripheral wires 9 and a lower insulating layer 11 covering the peripheral wires 9. The upper base 13 may include a metal and/or a metal silicide. For example, the upper base 13 may be formed of a conductive material layer including tungsten and a tungsten silicide disposed on tungsten. The impurity region 15 may be disposed on the upper base 13.

The stack structure 18 may be positioned on the impurity region 15. The stack structure 18 may include interlayer insulating layers 21 and gate layers 24 alternately layered.

The interlayer insulating layers 21 may include a lowermost interlayer insulating layer 21L and an uppermost interlayer insulating layer 21U. Among the interlayer insulating layers 21 and the gate layers 24, a lowermost layer may be configured as the lowermost interlayer insulating layer 21L, and an uppermost layer may be configured as the uppermost interlayer insulating layer 21U. For example, the interlayer insulating layers 21 may be formed of an insulating material, e.g., a silicon oxide, or the like.

In example embodiments, the gate layers 24 may be configured as gate electrodes. Thus, in the description below, the gate layers 24 will be referred to as gate electrodes.

In an example embodiment, a lower buffer layer 17 may be disposed between the stack structure 18 and the lower structure 3. The lower buffer layer 17 may be formed of a material having etch selectivity with respect to the interlayer insulating layers 21. For example, the lower buffer layer 17 may be formed of an insulating material, e.g., an aluminum oxide, or the like. In another example embodiment, the lower buffer layer 17 may not be provided.

The vertical structure 33 may be disposed in a hole 30 penetrating the stack structure 18. The hole 30 may be referred to as a 'vertical opening' or an 'opening'. The hole 30 may penetrate the stack structure 18 and may extend downwardly, e.g., along a vertical direction Z, and may penetrate the lower buffer layer 17. The hole 30 may expose a portion of the lower structure 3, e.g., a portion of the impurity region 15. The vertical structure 33 may be formed in the hole 30 to penetrate the stack structure 18 and the lower buffer layer 17.

The vertical structure 33 may include a pad pattern 57 along with the core region 55, the data storage structure 46, the channel semiconductor layer 38, and the gate dielectric layer 36 illustrated in FIG. 1. For example, as illustrated in FIG. 2A, the pad pattern 57 may be positioned on top surfaces of the core region 55 and the data storage structure 46, while the channel semiconductor layer 38 and the gate dielectric layer 36 may extend, e.g., continuously, along an, e.g., entire, outer surface, of each of the data storage structure 46 and the pattern 57, e.g., so top surfaces of the pad pattern 57, the channel semiconductor layer 38, and the gate dielectric layer 36 may be level with each other.

In detail, the core region 55 may be configured as an insulating pillar formed of an insulating material, e.g., a silicon oxide, or the like. For example, an upper portion of the core region 55 adjacent to the pad pattern 57 may be formed of a silicon oxide, and a lower portion of the core region 55 spaced apart from the pad pattern 57 may be formed of a silicon oxide including a void or may be formed of an air gap. The core region 55 may be spaced apart from a side wall of the hole 30, an upper surface of the core region 55 may be disposed on a level higher than an uppermost gate electrode of the gate electrodes 24, and a lower surface of the core region 55 may be disposed on a level lower than a lowermost gate electrode of the gate electrodes 24.

The channel semiconductor layer 38 may cover a side surface and a lower surface of the core region 55. The gate dielectric layer 36 may be interposed between an external side surface of the channel semiconductor layer 38 and the gate electrodes 24. In an example embodiment, the gate dielectric layer 36 may extend from portions interposed between the external side surface of the channel semiconductor layer 38 and the gate electrodes 24 to a space between the external side surface of the channel semiconductor layer 38 and the interlayer insulating layers 21.

The data storage structure 46 may be interposed between the core region 55 and the channel semiconductor layer 38, and may cover a side surface and a bottom surface of the core region 55. For example, as illustrated in FIG. 2A, the data storage structure 46 may be continuous along entire sidewalls and bottom of the core region 55.

The pad pattern 57 may be in contact with an upper surface of the core region 55. In an example embodiment, the pad pattern 57 may be in contact with an upper surface of the data storage structure 46. In an example embodiment, the pad pattern 57 may be in contact with an upper portion of a lateral side surface of the channel semiconductor layer 38. In an example embodiment, the pad pattern 57 may be formed of a doped silicon having N-type conductivity, e.g., a polysilicon.

The gate electrodes 24 may include word lines 24W, and at least one selection line 24S disposed on the word lines 24W. An insulating pattern 27 may be positioned to isolate the at least one selection line 24S of the gate electrodes 24 from each other in the second direction D2. The insulating pattern 27 may isolate the at least one selection line 24S in the second direction D2, may extend in the vertical direction Z, and may penetrate the uppermost interlayer insulating layer 21U. In an example embodiment, a thickness of each of the at least one selection line 24S may be greater than a thickness of each of the word lines 24W, e.g., in the vertical direction Z.

A first upper insulating layer 60 and a second upper insulating layer 73 may be layered and disposed on the stack structure 18 in order. Separation structures 66 may penetrate the first upper insulating layer 60 and the stack structure 18. The separation structures 66 may have a line form extending in the first direction D1, as illustrated in FIG. 1.

In an example embodiment, the separation structures 66 may be formed of an insulating material. In another example embodiment, the separation structures 66 may include an insulating material and a conductive material. For example, each of the separation structures 66 may include a first isolation pattern 68 formed of an insulating material and a second isolation pattern 70 formed of a conductive material.

The first isolation pattern 68 may be interposed between the second isolation pattern 70 and the stack structure 18.

A contact plug 76 penetrating the first and second upper insulating layers 60 and 73 and electrically connected to the vertical structure 33 may be disposed. The contact plug 76 may be in contact with and electrically connected to the pad pattern 57 of the vertical structure 33.

The conductive line 79 electrically connected to the contact plug 76 on the contact plug 76 may be disposed. The conductive line 79 may be configured as a bit line.

In an example embodiment, the data storage structure 46 includes a variable resistive material that has a non-uniform concentration of vacancies along its width. For example, the data storage structure 46 may include a variable resistive material that has an increasing vacancy concentration in a direction oriented from the channel semiconductor layer 38 toward the core region 55, e.g., the vacancy concentration may increase in a radial direction as a distance from an outer surface of the core region 55 decreases. For example, if the variable resistive material in the data storage structure 46 were to be separated into a first portion 48 (i.e., a first variable resistive layer 48) disposed between the channel semiconductor layer 38 and the core region 55, e.g., along an entire perimeter of the core region 55, and a second portion 50 (i.e., a second variable resistive layer 50) disposed between the first variable resistive layer 48 and the core region 55, e.g., along an entire perimeter of the core region 55, the vacancy concentration in the second portion 50 (portion closer to the core region 55) would be higher than the vacancy concentration of the first portion 48 (portion farther from the core region 55). Hereinafter, for convenience of explanation, the variable resistive material in the data storage structure 46 will be discussed in term of first and second portions 48 and 50 (or, interchangeably, in terms of "first variable resistive layer 48" and "second variable resistive layer 50") to facilitate reference to the different vacancy concentrations along the radial direction of the vertical structure 33. The first variable resistive layer 48 may be referred to as a first variable resistive material layer, and the second variable resistive layer 50 may be referred to as a second variable resistive material layer.

In an example embodiment, the variable resistive material in the data storage structure 46 may include a first element and oxygen. For example, the variable resistive material in the data storage structure 46 may include a transition metal element and oxygen with a concentration of oxygen vacancies in a resultant transition metal oxide, e.g., hafnium oxide (HfO), increasing toward the core region 55.

For example, referring to FIG. 2B, the first variable resistive layer 48 and the second variable resistive layer 50 may include a first element and oxygen in common. For example, the first element may be a metal element, e.g., Al, Mg, Zr, Hf, and the like. For instance, both the first variable resistive layer 48 and the second variable resistive layer 50 may be formed of an HfO material including Hf and O, and the concentration of oxygen vacancy in the HfO material included in the second variable resistive layer 50 may be higher than the concentration of oxygen vacancy of the HfO material included in the first variable resistive layer 48. Thus, the first and second variable resistive layer 48 and 50 may be configured as material layers including the same element.

In another example, one of the first variable resistive layer 48 and the second variable resistive layer 50 may be configured as an oxide including the first element and oxygen, and the other of the first variable resistive layer 48 and the second variable resistive layer 50 may be configured as a material including a second element different from the first element and oxygen. At least one of the first element and the second element may be a transition metal element. The first variable resistive layer 48 may be formed of a first material including the first element, and the second variable resistive layer 50 may be formed of a second material including the second element different from the first element. For example, the first variable resistive layer 48 may be formed of one of materials among $SiO_x$, $AlO_x$, $MgO_x$, $ZrO_x$, $HfO_x$, and $SiN_x$, and the second variable resistive layer 50 may be formed of a material different from the material of the first variable resistive layer 48 among $SiO_x$, $AlO_x$, $MgO_x$, $ZrO_x$, $HfO_x$, and $SiN_x$.

In an example embodiment, each of the first variable resistive layer 48 and the second variable resistive layer 50 may include a material having switching properties, e.g., one of $SiO_x$, $AlO_x$, $MgO_x$, $ZrO_x$, $HfO_x$, and $SiN_x$. For example, the first variable resistive layer 48 may be formed of $HfO_x$, and the second variable resistive layer 50 may be formed of $AlO_x$.

Regions of the data storage structure 46 facing side surfaces of the word lines 24W may be configured to store data, and may be configured as memory cells. In the example embodiment, by providing the data storage structure 46 including the first variable resistive layer 48 and the second variable resistive layer 50, distribution properties of the memory cells may improve.

In detail, the data storage regions of the data storage structure 46 facing the word lines 24W may be programed. For example, the program operation may include operations of selecting a word line of the word lines 24W facing the data storage region of the data storage structure 46 which may be required to be programmed, and deselecting the other words lines. The selected word line WLa among the word lines 24W may be turned off, and the non-selected word lines WLb1 and WLb2 may be turned on. For example, the program operation may include operations of applying 0 V or a negative voltage to the selected word line WLa, applying positive voltage higher than a threshold voltage, e.g., about 6V, to the non-selected word lines WLb1 and WLb2, applying a voltage of about 5V to about 6V to the conductive line 79 (i.e., to the bit line), and grounding the impurity region 15 (i.e., the common source line).

The dashed line in FIG. 2B indicates a flow of current 100 when the above described program operates, i.e., when the selected word line WLa is selected and turned off. That is, referring to FIG. 2B, the current 100 in FIG. 2B may flow along the channel semiconductor layer 38 facing the first non-selected word line WLb1 disposed upwardly of the selected word line WLa, shift into the data storage structure 46 facing the selected word line WLa due to resistance change caused by application of bias (i.e., flow through the data storage structure 46 in a region corresponding to the turned off selected word line WLa), and shift back to the channel semiconductor layer 38 facing the second non-selected word line WLb2 disposed downwardly of the selected word line WLa.

The increasing concentration of vacancies along the width of the data storage structure 46 along the direction oriented from the channel semiconductor layer 38 toward the center of the vertical structure 33 (e.g., as compared to a uniform concentration along the width or a concentration varying in an opposite direction) allows the current 100 to shift farther into the data storage structure 46, e.g., flow through the second variable resistive layer 50 rather than the first variable resistive layer 48 due to lower resistance in the second variable resistive layer 50 relative to the first variable resistive layer 48, thereby improving control and uniformity of current operation. That is, application of bias to the vertical structure 33, which includes the data storage structure 46 with the varying vacancy concentration, spreads the concentration of vacancies more uniformly along the vertical direction Z within the data storage structure 46 at the region corresponding to the selected gate electrode WLa, and forms two depletion regions, e.g., above and below the selected gate electrode WLa, with a reduced vertical distance between outermost vacancies and the channel semiconductor layer 38 in order to improve control and uniformity of current operation through the channel semiconductor layer 38.

As described above, as current flows along the data storage structure 46 facing the selected word line WLa, resistance of the data storage structure 46 changes, and the data storage region of the data storage structure 46 facing the selected word line WLa may be configured to be in a set state. By performing the program operation described above, resistance of the data storage structure 46 decreases.

In the example embodiment, the data storage structure 46 may form a single-level memory cell. For example, a data storage region of the data storage structure 46 facing the selected word line WLa may be configured to be in a first resistance state, and the data storage region of the data storage structure 46 in the first resistance state may form a single-level memory cell.

In another example embodiment, a data storage region of the data storage structure 46 may form a multi-level memory cell. For example, a data storage region of the data storage structure 46 facing the selected word line WLa may be configured to be in a first resistance state or may be configured to be in a second resistance state in which resistance is higher than resistance of the first resistance state depending on an applied program operation. Thus, as the data storage region of the data storage structure 46 facing the selected word line WLa is configured to be in different resistance states, the data storage structure 46 may form a multi-level memory cell.

An erasing operation may be performed on the data storage region of the data storage structure 46 programmed as above, and similarly to the above-described program operation, the erasing operation may include operations of turning off the selected word line WLa, turning on the non-selected word lines WLb1 and WLb2, applying an erase voltage, i.e., voltage of about 5V to about 6V, to the impurity region 15 (i.e., to the common source line), and grounding the conductive line 79 (i.e., the bit line). Accordingly, current may flow in a direction opposite to the direction illustrated in FIG. 2B, such that a magnetic field may change, and the data storage region of the data storage structure 46 facing the selected word line WLa may be configured to be in a reset state. By the erasing operation, resistance of the data storage region of the data storage structure 46 increases. Accordingly, resistance of the data storage region of the data storage structure 46 in the set state obtained by performing the program operation may be different from resistance in the rest state obtained by performing the erasing operation. For example, in the data storage region of the data storage structure 46, resistance in the set state may be lower than resistance in the reset state.

In an example embodiment, the data storage structure 46 may be included in a single-level memory cell. For example, a region of the data storage structure 46 opposing the selected word line WLa may enter a first resistance state, and the region of the data storage structure in the first resistance state may be included in a single-level memory cell.

In another example, the data storage structure 46 may be included in a multi-level cell MLC. For example, a region of the data storage structure 46 opposing the selected word line WL may be in a first resistance state or may be in a second resistance state, higher than the first resistance state in accordance with an applied program operation. Accordingly, the region of the data storage structure 46 opposing the selected word line WL may be configured to be in different resistance states, and the data storage structure 46 may be included in a multi-level memory cell.

Figure 3A:
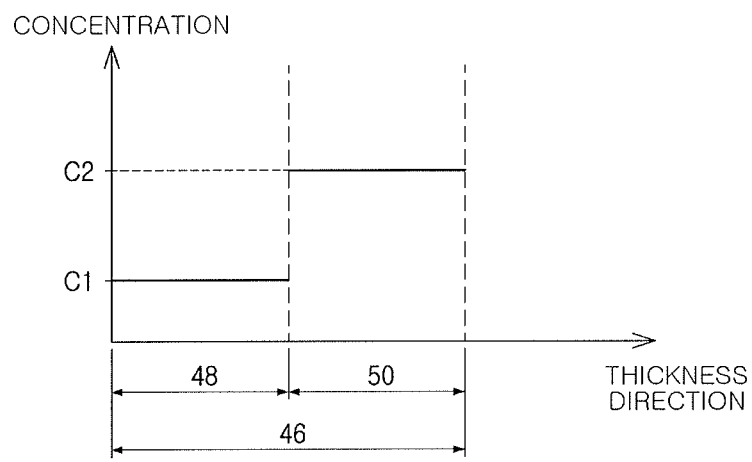
FIGS. 3A and 3B illustrate graphs of vacancy concentrations in a data storage structure of a semiconductor device according to example embodiments.
Figure 3B:
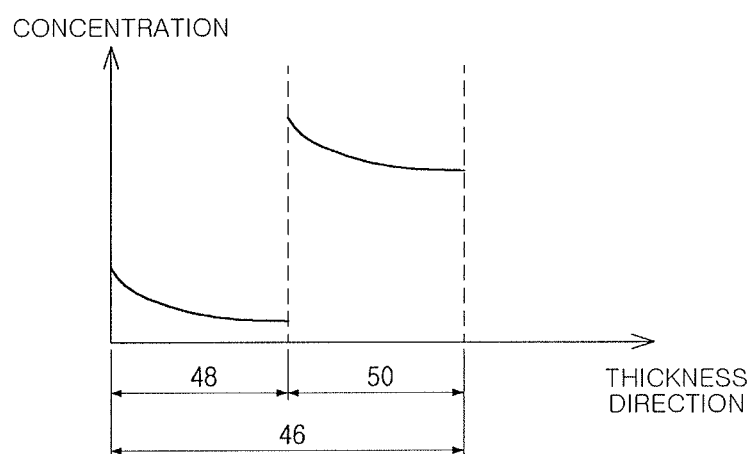

In the description below, a concentration of vacancies in the data storage structure 46, e.g., including the first variable resistive layer 48 and the second variable resistive layer 50, will be described with reference to FIGS. 3A and 3B. FIG. 3A is a graph illustrating an example of a concentration of vacancies in the data storage structure 46. FIG. 3B is a graph illustrating a modified example of a vacancy concentration in the data storage structure 46.

For example, referring to FIG. 3A, the data storage structure 46 may have a vacancy concentration changing in staircase form. That is, the concentration of vacancies along the width of the data storage structure 46 in the direction oriented from the channel semiconductor layer 38 toward the core region 55 may increase along a step profile.

In detail, for example, the first variable resistive layer 48 (i.e., portion of the data storage structure 46 closer to the channel semiconductor layer 38) may have a first vacancy concentration C1, and the second variable resistive layer 50 (i.e., portion of the data storage structure 46 closer to the core region 55) may have a second vacancy concentration C2 higher than the first vacancy concentration C1. The first vacancy concentration C1 may be constant over changes in thickness of the first variable resistive layer 48, and the second vacancy concentration C2 may be constant over changes in thickness of the second variable resistive layer 50.

In another example, referring to FIG. 3B, the data storage structure 46 may have a gradually changing vacancy concentration. For example, the vacancy concentration within the first variable resistive layer 48 may increase, as a distance from the second variable resistive layer 50 increases. Similarly, the vacancy concentration within the second variable resistive layer 50 may decreases, as a distance from the first variable resistive layer 48 increases.

For example, in the first variable resistive layer 48, a vacancy concentration of a portion of the first variable resistive layer 48 in contact with the channel semiconductor layer 38 (in FIG. 2B) may be higher than a vacancy concentration of a portion of the first variable resistive layer 48 in contact with the second variable resistive layer 50. In the second variable resistive layer 50, a vacancy concentration of a portion of the second variable resistive layer 50 in contact with the first variable resistive layer 48 may be higher than a vacancy concentration of a portion of the second variable resistive layer 50 in contact with the core region 55 (in FIG. 2B). Thus, a vacancy concentration of the second variable resistive layer 50 may be higher than a vacancy concentration of the first variable resistive layer 48.

Figure 3C:
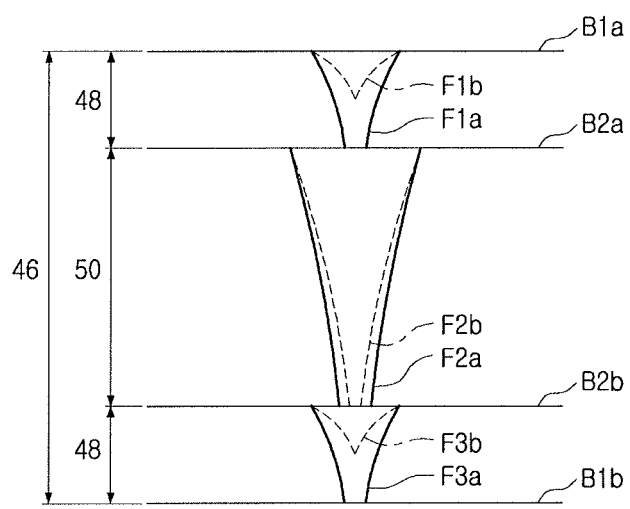
FIG. 3C illustrates a conceptual diagram of changes in vacancy concentration of the data storage structure illustrated in FIG. 3A or FIG. 3B in a set state and a reset state.

In the description below, vacancy concentrations of the data storage structure 46 in a set state and a reset state, a method of a program operation, and a method of an erasing operation will be described with reference to FIG. 3C. FIG. 3C is a conceptual diagram illustrating changes in vacancy concentration of the data storage structure 46 in a set state and a reset state of the data storage structure 46, a vacancy concentration of which changes in staircase form as illustrated in FIG. 3A or FIG. 3B.

In FIG. 3C, an element B1a is a first boundary surface B1a between the channel semiconductor layer 38 and the first variable resistive layer 48 from which a set current starts flowing from the channel semiconductor layer 38 into the first variable resistive layer 48, and an element B2a is a second boundary surface B2a from which a set current starts flowing from the first variable resistive layer 48 into the second variable resistive layer 50. An element B2b is a third boundary surface B2b from which a set current flowing in the second variable resistive layer 50 starts flowing from the second variable resistive layer 50 into the first variable resistive layer 48, and an element B1b is a fourth boundary surface B1b between the first variable resistive layer 48 and the channel semiconductor layer 38 from which a current passing through the first variable resistive layer 48 flows into the channel semiconductor layer 38. Therefore, the arrangement of the boundaries B1a, B2a, B2b, and B1b in FIG. 3C schematically reflect the path of current in a region corresponding to the selected word line WLa in FIG. 2B. The set current may be the current produced by the program operation.

Referring to FIG. 3C, in the region of the data storage structure 46 configured to be in a set state by the program operation, a first filament Fla may be formed in the first variable resistive layer 48 between the first boundary surface B1a and the second boundary surface B2a, a second filament F2a may be formed in the second variable resistive layer 50 between the second boundary surface B2a and the third boundary surface B2b, and a third filament F3a may be formed in the first variable resistive layer 48 between the third boundary surface B2b and the fourth boundary surface B1b. The first filament Fla, the second filament F2a, and the third filament F3a may be connected to one another. Accordingly, a current path may be formed along the first filament Fla, the second filament F2a, and the third filament F3a consecutively connected in the data storage structure 46, i.e., the first through third filaments reflect the actual current path through the data storage structure 46.

In the first filament F1a, a vacancy concentration of a region of the first filament Fla adjacent to the first boundary surface B1a may be higher than a vacancy concentration of a region of the first filament F1a adjacent to the second boundary surface B2a. In the second filament F2a, a vacancy concentration of a region of the second filament F2a adjacent to the second boundary surface B2a may be higher than a vacancy concentration of a region of the second filament F2a adjacent to the third boundary surface B2b. In the third filament F3a, a vacancy concentration of a region of the third filament F3a adjacent to the third boundary surface B2b may be higher than a vacancy concentration of a region of the third filament F3a adjacent to the fourth boundary surface B1b.

In the region of the data storage structure 46 configured to be in a reset state by the erasing operation, a first transformed filament F1b may be formed in the first variable resistive layer 48 between the first boundary surface B1a and the second boundary surface B2a, a second transformed filament F2b may be formed in the second variable resistive layer 50 between the second boundary surface B2a and the third boundary surface B2b, and a third transformed filament F3b may be formed between the third boundary surface B2b and the fourth boundary surface B1b.

In FIG. 3C, widths of the first to third filaments F1a, F2a, and F3a and the first to third transformed filaments F1b, F2b, and F3b may indicate a concentration of vacancies. For example, in the first to third filaments F1a, F2a, and F3a and the first to third transformed filaments F1b, F2b, and F3b, a portion having a relatively great width may indicate that a concentration of vacancies is relatively high, and a portion having a relatively small width may indicate that a concentration of vacancies is relatively low.

The first modified filament F1$b$ may be in contact with the first boundary surface B1$a$ and may be substantially spaced apart from the second boundary surface B2$a$. A vacancy concentration of a region of the second transformed filament F2$b$ adjacent to the third boundary surface B2$b$ may decrease as compared to the second filament F2$a$. The third transformed filament F3$b$ may be in contact with the third boundary surface B2$b$ and may be substantially spaced apart from the fourth boundary surface B1$b$. Accordingly, in the region of the data storage structure 46 in a reset state, the first transformed filament F1$b$ may be disconnected from the second transformed filament F2$b$, and the third transformed filament F3$b$ may be disconnected from the fourth boundary surface B1$b$.

As described above, the region of the data storage structure 46 in a set state may include the first to third filaments F1$a$, F2$a$, and F3$a$ connected to one another, and the region of the data storage structure 46 in a reset state may include the first to third transformed filaments F1$b$, F2$b$, and F3$b$, at least one of which is disconnected from the other.

In the description below, a modified example of a concentration of vacancies in the data storage structure 46 after forming the data storage structure 46 by a deposition process will be described with reference to FIG. 4A. FIG. 4 is a graph illustrating a modified example of a concentration of vacancies in the data storage structure 46.

Figure 4A:
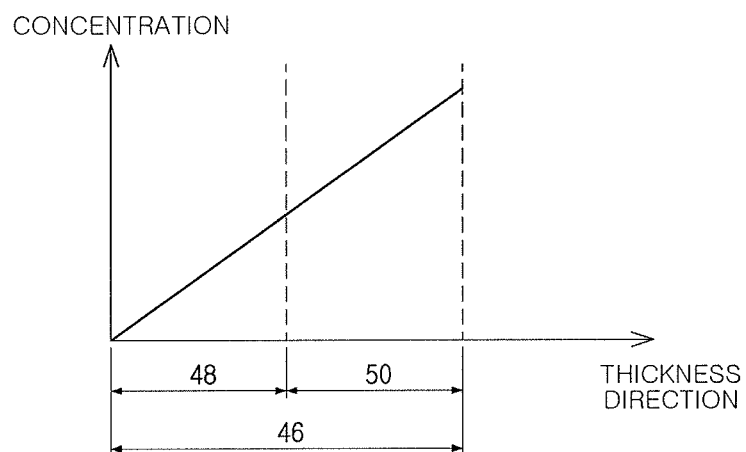
FIG. 4A illustrates a graph of a vacancy concentration in a data storage structure of a semiconductor device according to another example embodiment.

In the modified example, according to FIG. 4A, the data storage structure 46 may have a constantly changing vacancy concentration. For example, in the data storage structure 46, a vacancy concentration may gradually increase from the first variable resistive layer 48 to the second variable resistive layer 50. Accordingly, the second variable resistive layer 50 may have a vacancy concentration higher than the vacancy concentration of the first variable resistive layer 48.

Figure 4B:
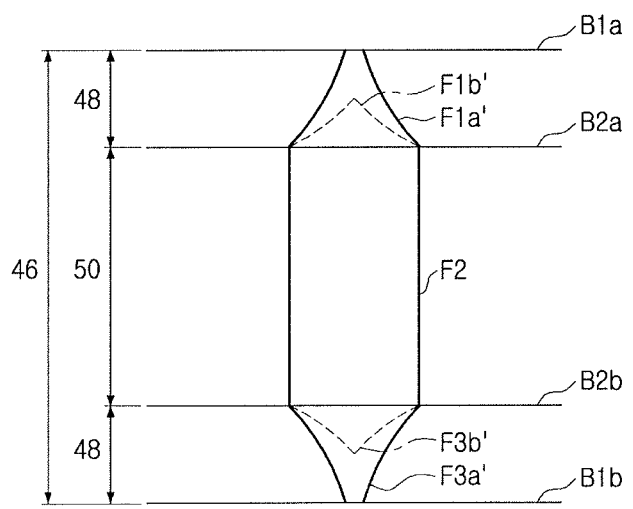
FIG. 4B illustrates a conceptual diagram of changes in vacancy concentration of the data storage structure illustrated in FIG. 4A in a set state and a reset state.

In the description below, a vacancy concentration of the data storage structure 46 in a set state and a reset state will be described with reference to FIG. 4B. FIG. 4B illustrates changes in vacancy concentration of the data storage structure 46 in a set state and a reset state. In FIG. 4B, elements B1$a$, B2$a$, B2$b$, and B1$b$ correspond to the first boundary surface B1$a$, the second boundary surface B2$a$, the third boundary surface B2$b$, and the fourth boundary surface B1$b$ illustrated in FIG. 3C, respectively.

Referring to FIG. 4B, in the region of the data storage structure 46 configured to be in a set state by the program operation, a first filament F1$a$' may be formed in the first variable resistive layer 48 between the first boundary surface B1$a$ and the second boundary surface B2$a$, a second filament F2 may be formed in the second variable resistive layer 50 between the second boundary surface B2$a$ and the third boundary surface B2$b$, and a third filament F3$a$' may be formed in the first variable resistive layer 48 between the third boundary surface B2$b$ and the fourth boundary surface B1$b$. The first filament F1$a$', the second filament F2, and the third filament F3$a$' may be connected to one another. Accordingly, a current path may be formed along the first filament F1$a$', the second filament F2, and the third filament F3$a$' consecutively connected in the data storage structure 46.

In the first filament F1$a$', a vacancy concentration of a region of the first filament F1$a$' adjacent to the first boundary surface B1$a$ may be lower than a vacancy concentration of a region of the first filament F1$a$' adjacent to the second boundary surface B2$a$. In the second filament F2, a vacancy concentration of a region of the second filament F2 adjacent to the second boundary surface B2$a$ may be substantially the same as a vacancy concentration of a region of the second filament F2 adjacent to the third boundary surface B2$b$. In the third filament F3$a$', a vacancy concentration of a region of the third filament F3$a$' adjacent to the third boundary surface B2$b$ may be lower than a vacancy concentration of a region of the third filament F3$a$' adjacent to the fourth boundary surface B1$b$.

In the region of the data storage structure 46 configured to be in a reset state by the erasing operation, a first transformed filament F1$b$' may be formed in the first variable resistive layer 48 between the first boundary surface B1$a$ and the second boundary surface B2$a$, the second filament F2 may not be substantially transformed in the second variable resistive layer 50 between the second boundary surface B2$a$ and the third boundary surface B2$b$, and a third transformed filament F3$b$' may be formed between the third boundary surface B2$b$ and the fourth boundary surface B1$b$.

In FIG. 4B, widths of the first to third filaments F1$a$', F2, and F3$a$' and the first and third transformed filaments F1$b$' and F3$b$' may indicate a concentration of vacancies. For example, in the first to third filaments F1$a$', F2, and F3$a$' and the first and third transformed filaments F1$b$' and F3$b$', a portion having a relatively great width may indicate that a concentration of vacancies is relatively high, and a portion having a relatively small width may indicate that a concentration of vacancies is relatively low.

The first transformed filament F1$b$' may be spaced apart from and disconnected from the first boundary surface B1$a$, and may maintain connection with the second filament F2. The third transformed filament F3$b$' may maintain connection with the second filament F2 and may be spaced apart from and disconnected from the fourth boundary surface B1$b$. Accordingly, in the region of the data storage structure 46 in a reset state, the first transformed filament F1$b$' may be disconnected from the first boundary surface B1$a$, and the third transformed filament F3$b$' may be disconnected from the fourth boundary surface B1$b$.

Figure 5A:
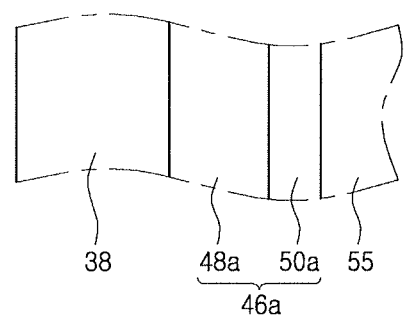
FIG. 5A illustrates an enlarged cross-sectional diagram of a modified example of a portion of a data storage structure of a semiconductor device, according to an example embodiment.
Figure 5B:
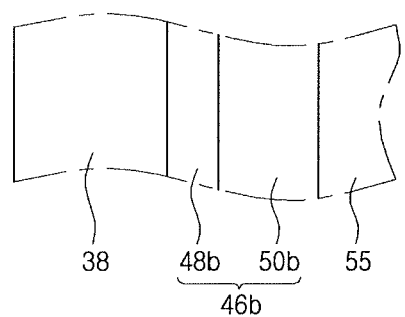
FIG. 5B illustrates an enlarged cross-sectional diagram of another modified example of a portion of a data storage structure of a semiconductor device, according to another example embodiment.

Referring back to FIGS. 1, 2A, and 2B, the first variable resistive layer 48 and the second variable resistive layer 50 may have the same thickness, e.g., along the second direction D2, but an example embodiment thereof is not limited thereto. For example, the first variable resistive layer 48 and the second variable resistive layer 50 may be configured to have different thicknesses, e.g., along the second direction D2. For example, the thickness of each of the first variable resistive layer 48 and the second variable resistive layer 50 may be about 1 nm to about 5 nm. Examples of the variable resistive layers configured to have different thicknesses will be described with reference to FIGS. 5A and 5B. FIGS. 5A and 5B are enlarged diagrams illustrating portions of variable resistive layers configured to have different thicknesses.

In a modified example, referring to FIG. 5A, a data storage structure 46$a$ may include a first variable resistive layer 48$a$, and a second variable resistive layer 50$a$ having a thickness less than a thickness of the first variable resistive layer 48$a$. By configuring a thickness of the first variable resistive layer 48$a$ to be greater than a thickness of the second variable resistive layer 50$a$, a semiconductor device may operate with relatively lower current, thereby reducing power consumption of a semiconductor device. In another modified example, referring to FIG. 5B, a data storage structure 46$b$ may include a first variable resistive layer 48$b$, and a second variable resistive layer 50$b$ having a thickness less than a thickness of the first variable resistive layer 48b. By configuring a thickness of the first variable resistive layer 48b to be less than a thickness of the second variable resistive layer 50b, distribution property may improve.

Figure 6A:
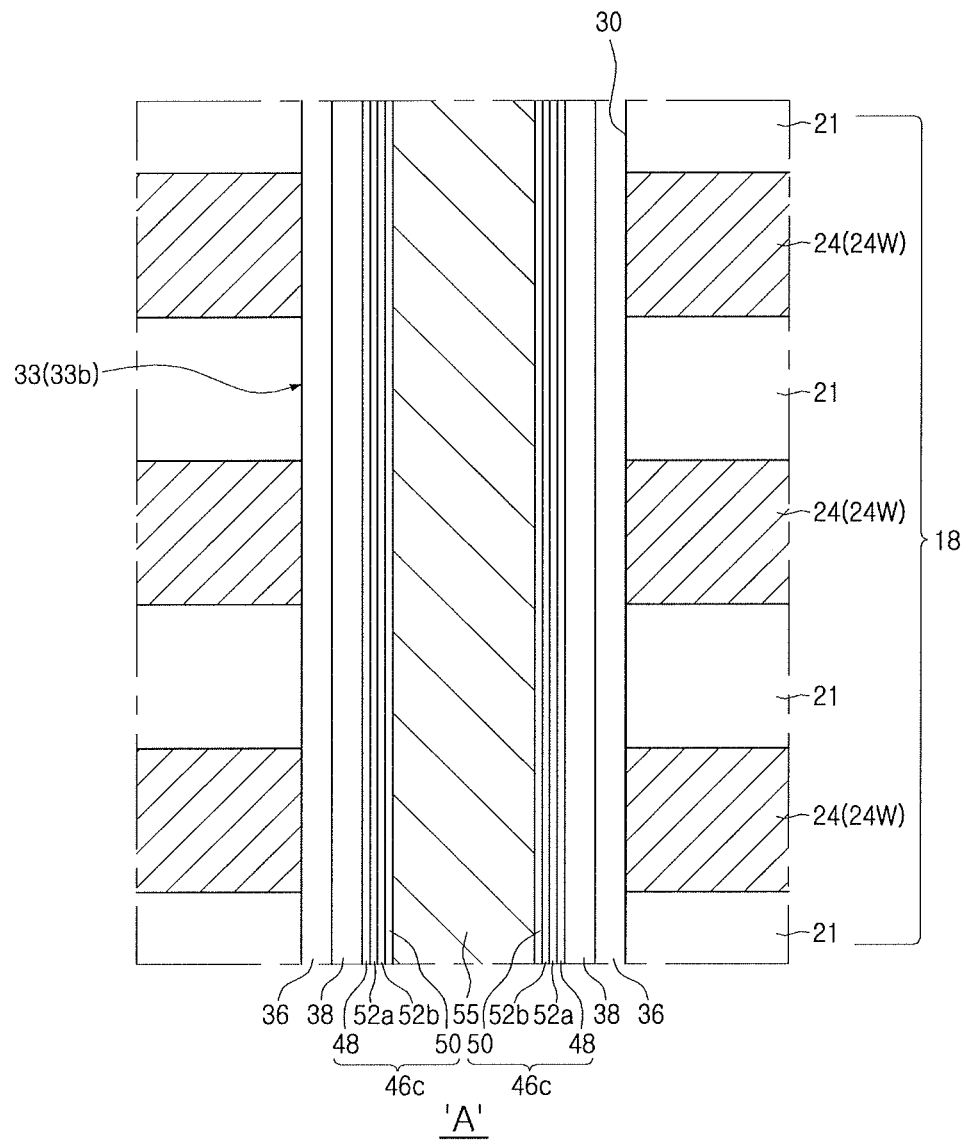
FIG. 6A illustrates an enlarged diagram of a semiconductor device, according to another example embodiment.

In the description below, a modified example of a stack structure will be described with reference to FIG. 6A. FIG. 6A is an enlarged diagram corresponding to the portion A illustrated in FIG. 2B.

In a modified example, referring to FIG. 6A, a vertical structure 33b may include a data storage structure 46c along with the gate dielectric layer 36, the channel semiconductor layer 38, the core region 55, and the pad pattern 57, described in the aforementioned example embodiment.

The data storage structure 46c may include the first variable resistive layer 48 and the second variable resistive layer 50 illustrated in FIGS. 2A and 2B. The data storage structure 46c may further include one of or a plurality of additional variable resistive layers 52a and 52b disposed between the first variable resistive layer 48 and the second variable resistive layer 50. A vacancy concentration of the one of or the plurality of additional variable resistive layers 52a and 52b may be higher than a vacancy concentration of the first variable resistive layer 48 and may be lower than a vacancy concentration of the second variable resistive layer 50.

In an example embodiment, one or a plurality of the additional variable resistive layers 52a and 52b may be a single additional variable resistive layer.

In an example embodiment, a plurality of the additional variable resistive layers 52a and 52b may be provided, and the plurality of additional variable resistive layers 52a and 52b may include the first additional variable resistive layer 52a and the second additional variable resistive layer 52b. The first additional variable resistive layer 52a may be interposed between the second additional variable resistive layer 52b and the first variable resistive layer 48.

A vacancy concentration of the first additional variable resistive layer 52a may be higher than a vacancy concentration of the first variable resistive layer 48. A vacancy concentration of the second additional variable resistive layer 52b may be higher than a vacancy concentration of the first additional variable resistive layer 52a and may be lower than a vacancy concentration of the second variable resistive layer 50.

In the example embodiment, the first variable resistive layer 48 may be referred to as a first layer, the first additional variable resistive layer 52a may be referred to as a second layer, the second additional variable resistive layer 52b may be referred to as a third layer, and the second variable resistive layer 50 may be referred to as a fourth layer. In the example embodiment, by providing the data storage structure 46c including the first layer 48, the second layer 52a, the third layer 52a, and the fourth layer 52b, distribution property may improve.

In the example embodiment, the data storage structure 46c may form a single-level memory cell. In the example embodiment, the data storage structure 46c may form a multi-level memory cell.

Figure 6B:
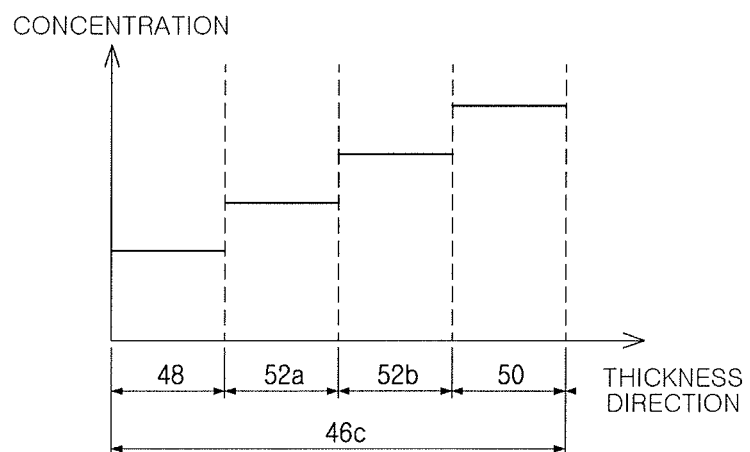
FIGS. 6B to 6E illustrate graphs of vacancy concentrations in a data storage structure of a semiconductor device according to example embodiments.
Figure 6C:
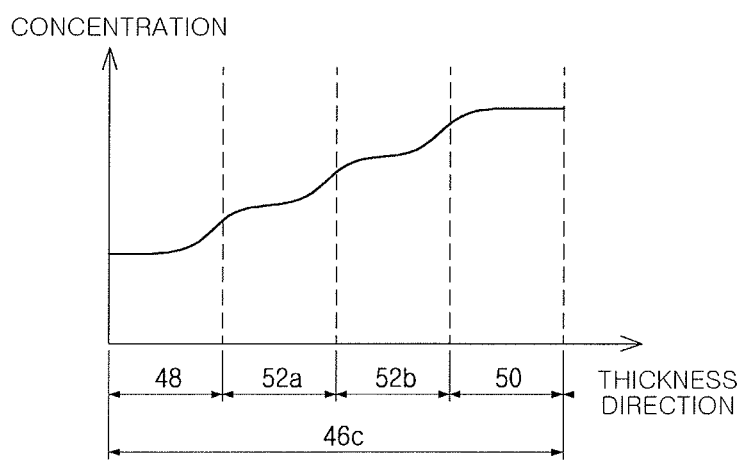
Figure 6D:
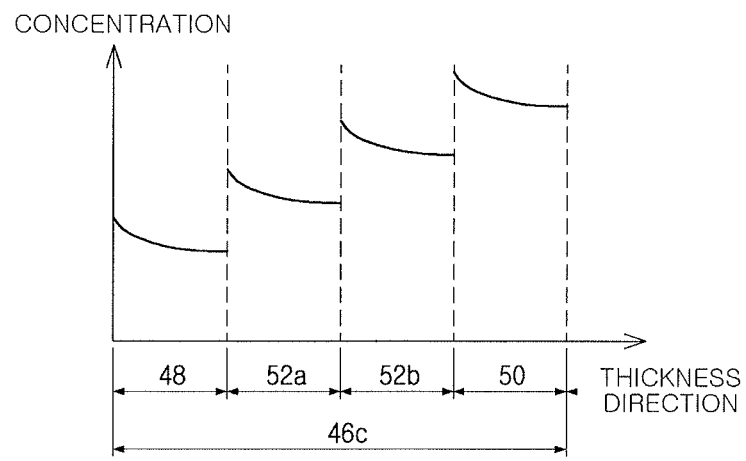
Figure 6E:
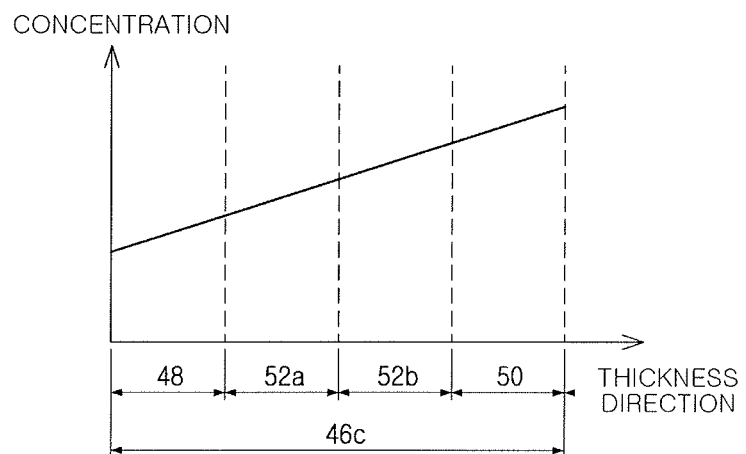

In the description below, a vacancy concentration of the data storage structure 46c will be described with reference to FIGS. 6B, 6C, 6D, and 6E. FIGS. 6B, 6C, 6D, and 6E are graphs illustrating one or more examples of vacancy concentrations of the data storage structure 46c. For example, FIG. 6A is a graph illustrating an example of a concentration of vacancy in the data storage structure 46c. FIG. 6B is a graph illustrating a modified example of a concentration of vacancy in the data storage structure 46c. FIG. 6C is a graph illustrating another modified example of a concentration of vacancy in the data storage structure 46c. FIG. 6D is a graph illustrating another modified example of a concentration of vacancy in the data storage structure 46c. FIG. 6E is a graph illustrating another modified example of a concentration of vacancy in the data storage structure 46c.

Referring to FIG. 6B, the data storage structure 46c may have a vacancy concentration changing in staircase profile, similarly to the example embodiment illustrated in FIG. 3A. For example, the data storage structure 46c may include the first variable resistive layer 48a, the first additional variable resistive layer 52a, the second additional variable resistive layer 52b, and the second variable resistive layer 50 disposed in order in a direction of the core region 55 (in FIG. 6A) in the channel semiconductor layer 38 (in FIG. 6A). A vacancy concentration of the first additional variable resistive layer 52a may be higher than a vacancy concentration of the first variable resistive layer 48, a vacancy concentration of the second additional variable resistive layer 52b may be higher than a vacancy concentration of the first additional variable resistive layer 52a, and a vacancy concentration of the second variable resistive layer 50 may be higher than a vacancy concentration of the second additional variable resistive layer 52b. As described above, when one of the first additional variable resistive layer 52a and the second additional variable resistive layer 52b is not provided, a vacancy concentration of one of the first additional variable resistive layer 52a and the second additional variable resistive layer 52b may be higher than a vacancy concentration of the first variable resistive layer 48 and may be lower than a vacancy concentration of the second variable resistive layer 50.

In the description below, although a description of the data storage structure 46c in which one of the first additional variable resistive layer 52a and the second additional variable resistive layer 52b is not provided, as described above, a vacancy concentration of the data storage structure 46c in which one of the first additional variable resistive layer 52a and the second additional variable resistive layer 52b is not provided may be understood based on the description of a vacancy concentration of the data storage structure 46c including both of the first additional variable resistive layer 52a and the second additional variable resistive layer 52b.

In a modified example embodiment, referring to FIG. 6C, a vacancy concentration of at least a portion of the data storage structure 46c may have a concentration profile having a tendency for increasing towards the second variable resistive layer 50 from the first variable resistive layer 48. For example, vacancy concentration profiles of the first additional variable resistive layer 52a and the second additional variable resistive layer 52b may increase in a direction of the second variable resistive layer 50 from the first variable resistive layer 48. A slope of a vacancy concentration of a boundary portion between the first variable resistive layer 48 and the first additional variable resistive layer 52a and a slope of a vacancy concentration of a boundary portion between the first additional variable resistive layer 52a and the second additional variable resistive layer 52b may be steeper than a slope of a vacancy concentration of a central portion of the first additional variable resistive layer 52a and a slope of a vacancy concentration of a central portion of the second additional variable resistive layer 52b.

In a modified example embodiment, referring to FIG. 6D, the data storage structure 46 may have a vacancy concentration changing in staircase profile, similarly to the example embodiment illustrated in FIG. 3D. For example, a vacancy concentration of a portion of the first variable resistive layer 48 adjacent to the channel semiconductor layer 38 (in FIG.

6A) may be higher than a vacancy concentration of a portion of the first variable resistive layer 48 adjacent to the first additional variable resistive layer 52a, a vacancy concentration of a portion of the first additional variable resistive layer 52a adjacent to the first variable resistive layer 48 may be higher than a vacancy concentration of a portion of the first additional variable resistive layer 52a adjacent to the second additional variable resistive layer 52b, a vacancy concentration of a portion of the second additional variable resistive layer 52b adjacent to the first additional variable resistive layer 52a may be higher than a vacancy concentration of a portion of the second additional variable resistive layer 52b adjacent to the second variable resistive layer 50, and a vacancy concentration of a portion of the second variable resistive layer 50 in contact with the second additional variable resistive layer 52b may be higher than a vacancy concentration of a portion of the second variable resistive layer 50 in contact with the core region 55 (in FIG. 6A).

In a modified example, referring to FIG. 6E, the data storage structure 46 may have a vacancy concentration changing with a constant slope, similarly to the example embodiment illustrated in FIG. 4A.

Figure 6F:
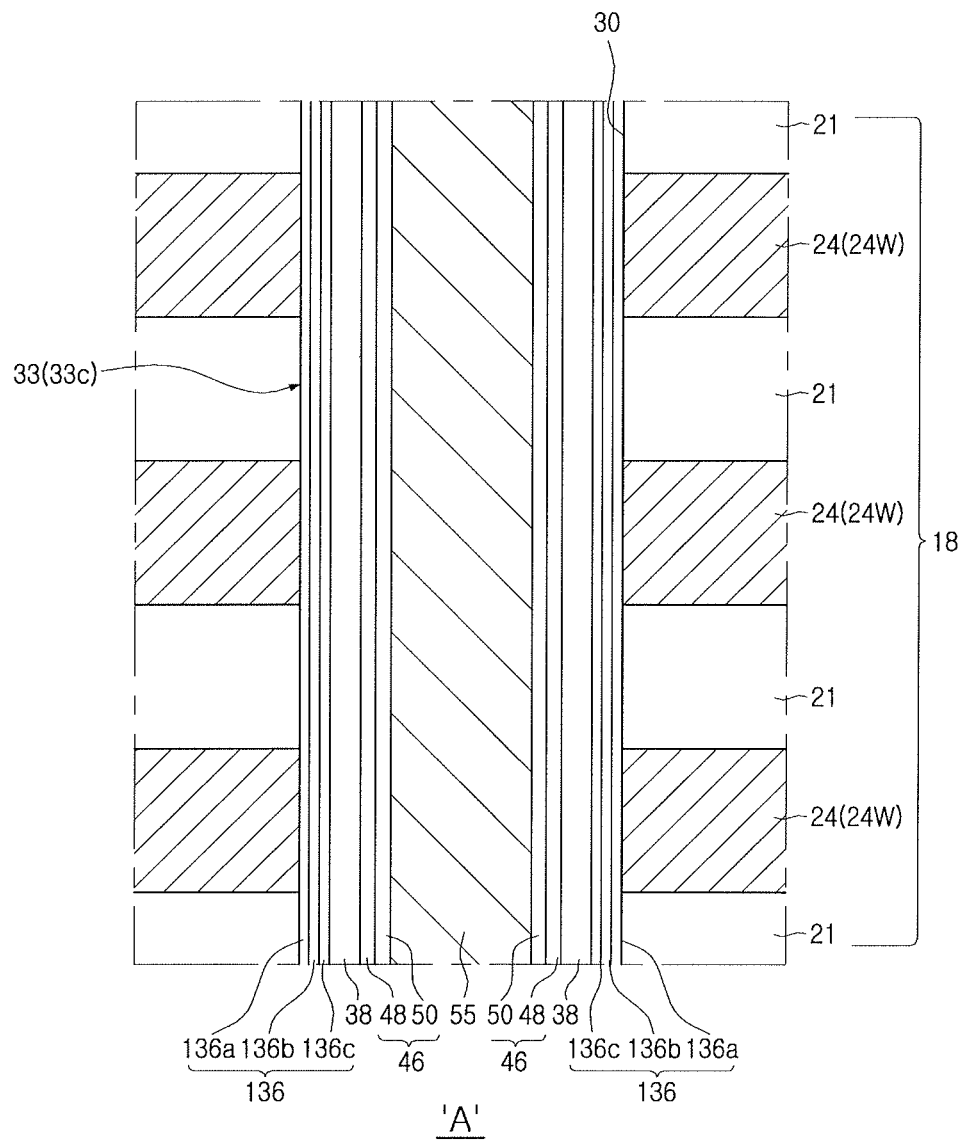
FIG. 6F illustrates an enlarged diagram of a semiconductor device, according to another example embodiment.

In the description below, a modified example of a stack structure will be described with reference to FIG. 6F. FIG. 6F is an enlarged diagram corresponding to portion A illustrated in FIG. 2B.

In the modified example, referring to FIG. 6F, a vertical structure 33c may include a dielectric structure 136 instead of the gate dielectric layer 36 (in FIG. 2B) described in the aforementioned example embodiment. Accordingly, the vertical structure 33c may include the dielectric structure 136 along with the channel semiconductor layer 38, the core region 55, the pad pattern 57, and the data storage structure 46 described in the aforementioned example embodiment.

The dielectric structure 136 may include a first dielectric layer 136a, a data storage layer 136b, and a second dielectric layer 136c. The data storage layer 136b may be an electric charge trapping layer trapping electric charge. The first dielectric layer 136a may be formed of, e.g., a silicon oxide or a silicon oxide doped with nitrogen. The data storage layer 136b may be formed of a material trapping electric charge, e.g., a silicon nitride. The second dielectric layer 136c may include, e.g., a silicon oxide and a high-k dielectric.

The data storage layer 136b in the dielectric structure 136 may be used as a data storage region of a NAND flash memory, and the data storage structure 46 may be used as a data storage region of a variable resistive memory device. As data storage regions may be disposed on both sides of the channel semiconductor layer 38, data storage density may increase.

Figure 6G:
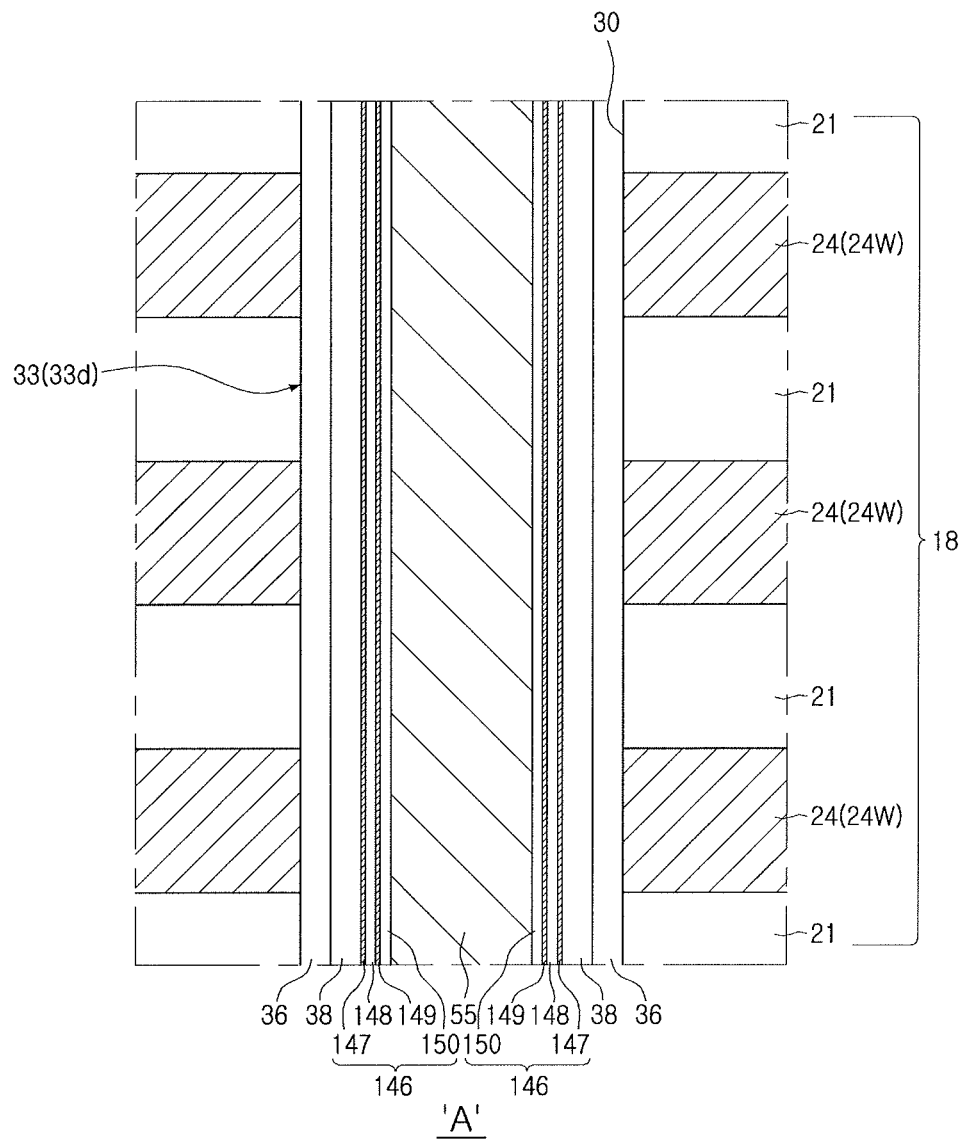
FIG. 6G illustrates an enlarged diagram of a semiconductor device, according to another example embodiment.

In the description below, a modified example of a stack structure will be described with reference to FIG. 6G. FIG. 6G is an enlarged diagram corresponding to portion A illustrated in FIG. 2B.

In the modified example, referring to FIG. 6G, a vertical structure 33d may include the data storage structure 146 along with the gate dielectric layer 36, the channel semiconductor layer 38, the core region 55, and the pad pattern 57 described in the aforementioned example embodiment.

The data storage structure 146 may include a plurality of separation layers and a plurality of data storage layers alternately layered. Each of the plurality of data storage layers may include a phase change material.

The plurality of data storage layers may include a first phase change material layer 148 and a second phase change material layer 150. The plurality of separation layers may include a first separation layer 147 disposed between the first phase change material layer 148 and the channel semiconductor layer 38, and a second separation layer 149 disposed between the first phase change material layer 148 and the second phase change material layer 150. A thickness of each of the first phase change material layer 148 and the second phase change material layer 150 may be greater than a thickness of each of the first separation layer 147 and the second separation layer 149.

Each of the plurality of phase change material layers 148 and 150 may be formed of a phase change memory material, e.g., a chalcogenide material including Ge, Sb, and/or Te, or the like. Alternatively, each of the plurality of phase change material layers 148 and 150 may be formed of a phase change memory material including at least one of, e.g., Te and Se, and at least one of, e.g., Ge, Sb, Bi, Pb, Sn, As, S, Si, P, O, N, and In.

The plurality of phase change material layers 148 and 150 may include a first element in common, and a concentration of the first element in the second phase change material layer 150 may be higher than a concentration of the first element included in the first phase change material layer 148. The first element may be Sb or Te. The plurality of separation layers 147 and 149 may be formed of a metal nitride, e.g., TiN, and the like.

In the example embodiment, by providing the data storage structure 146 including the plurality of separation layers 147 and 149 and the plurality of phase change material layers 148 and 150, distribution property may improve.

Figure 7A:
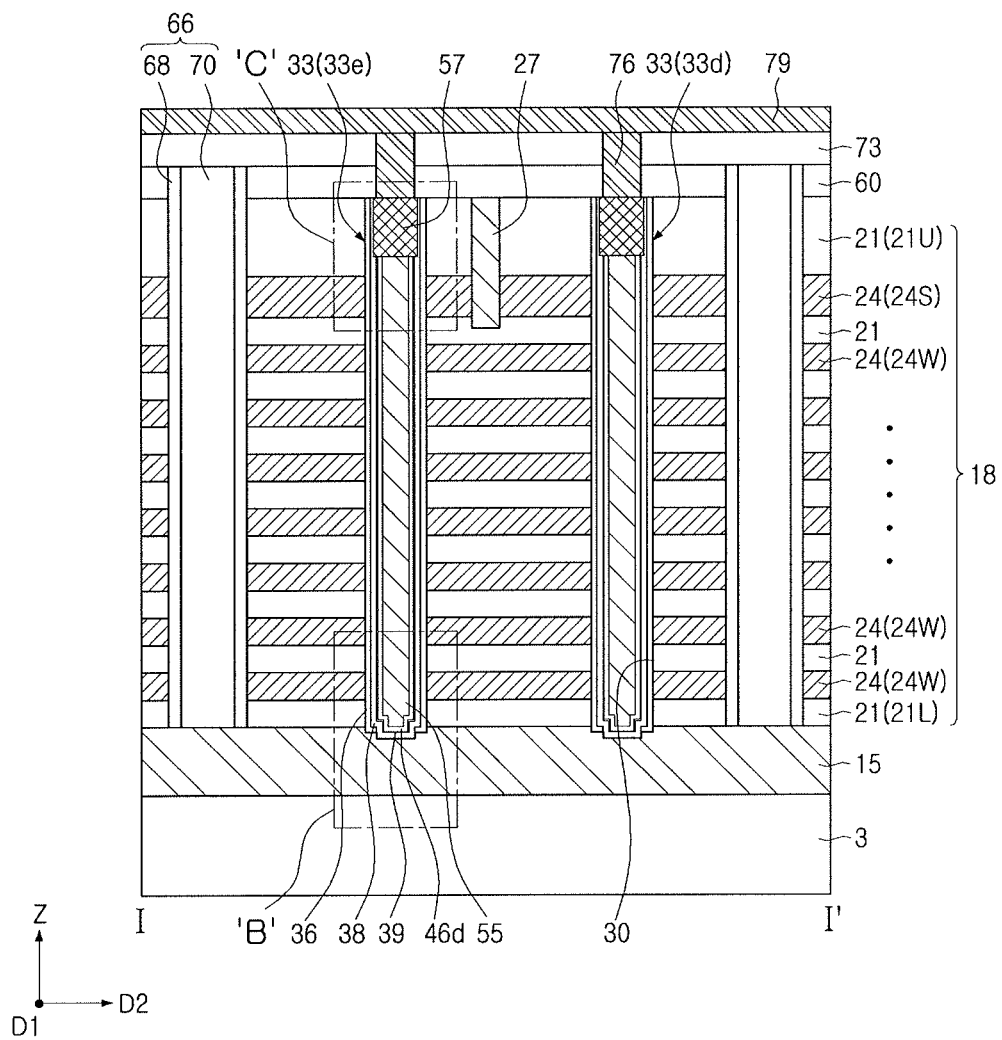
FIG. 7A illustrates a cross-sectional diagram of a semiconductor device according to another example embodiment.

In the description below, a modified example of the vertical structure 33 described with reference to FIG. 1 will be described with reference to FIGS. 7A, 7B, and 7C. FIG. 7A is a cross-sectional diagram illustrating a region taken along line I-I' in FIG. 1, FIG. 7B is an enlarged diagram illustrating portion B in FIG. 7A, and FIG. 7C is an enlarged diagram illustrating portion C in FIG. 7A.

Figure 7B:
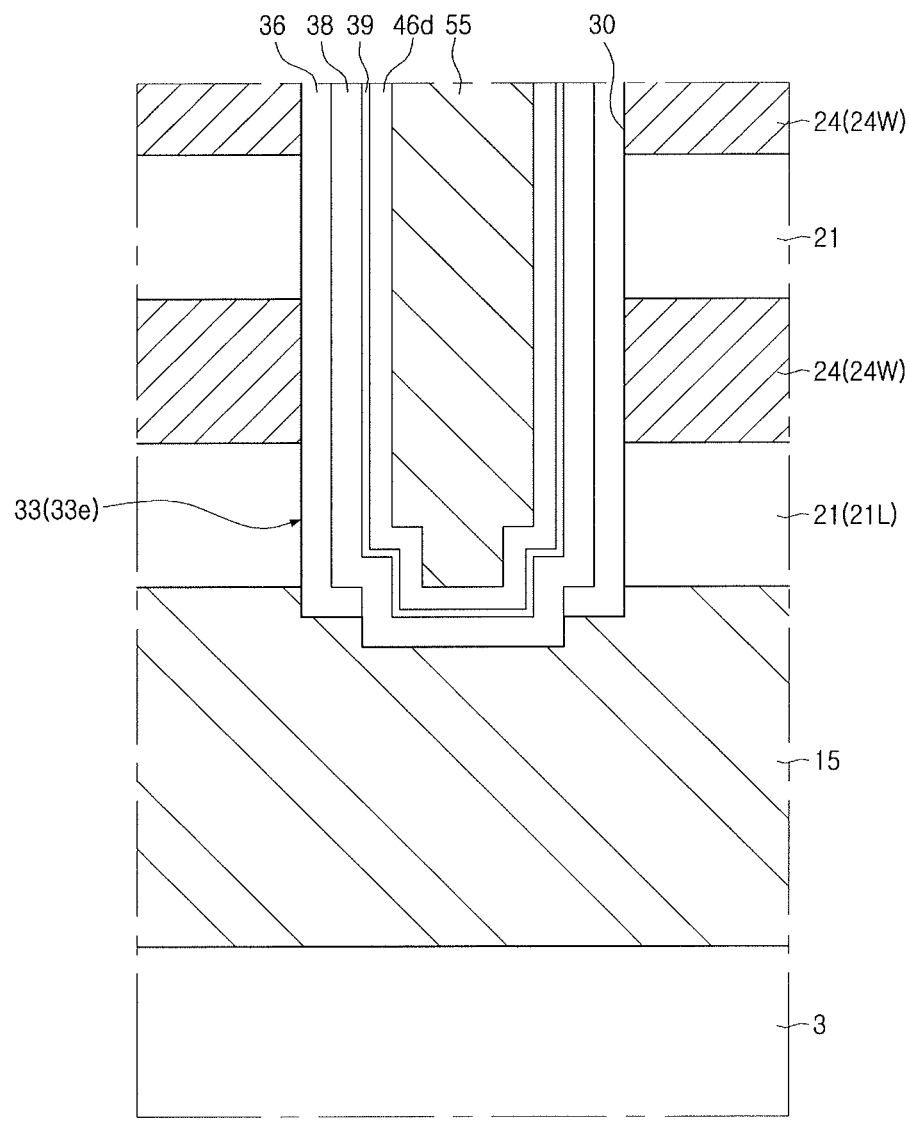
FIGS. 7B and 7C illustrate enlarged diagrams of portions "B" and "C", respectively, in FIG. 7A.
Figure 7C:
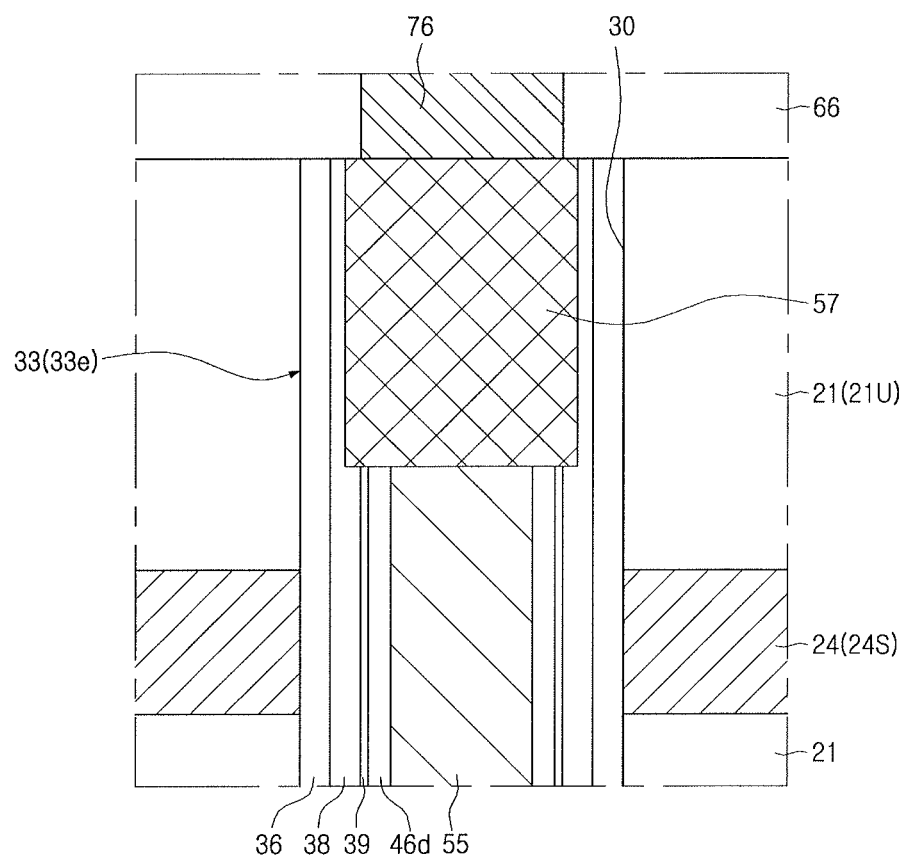

Referring to FIGS. FIGS. 7A, 7B, and 7C, a vertical structure 33e may include a data storage structure 46d and a buffer semiconductor layer 39 along with the gate dielectric layer 36, the channel semiconductor layer 38, the core region 55, and the pad pattern 57 described in the aforementioned example embodiment. In an example embodiment, the data storage structure 46d may be configured as a single variable resistive layer. The buffer semiconductor layer 39 may be referred to as a buffer layer.

The buffer semiconductor layer 39 may be interposed between the data storage structure 46d and the channel semiconductor layer 38. The buffer semiconductor layer 39 may be formed, e.g., in its entirety, of a material having a structure with smaller grains than the channel semiconductor layer 38.

For example, the channel semiconductor layer 38 may be formed of a polysilicon, and the buffer semiconductor layer 39 may be formed of an amorphous silicon. In another example, the channel semiconductor layer 38 may be formed of a first polysilicon, and the buffer semiconductor layer 39 may be formed of a second polysilicon having grains smaller than grains of the first polysilicon.

For example, when the buffer semiconductor layer 39 is formed of a material having a structure with smaller grains than the channel semiconductor layer 38, e.g., when the buffer semiconductor layer 39 is formed of amorphous silicon, filaments formed through the buffer semiconductor layer 39 upon application of bias (e.g., as described previously with reference to FIGS. 3C and 4B) may be more easily aligned with grain boundaries of smaller grains, thereby improving uniformity of vacancy distribution along the vertical direction Z. In other words, smaller grains contribute to a straighter current path through the grain boundary (i.e., via the filaments).

In an example embodiment, a thickness of the buffer semiconductor layer 39 may be less than a thickness of the channel semiconductor layer 38. For example, the thickness of the buffer semiconductor layer 39 may be about 0.5 nm to about 2 nm, and the thickness of the channel semiconductor layer 38 may be about 2 nm to about 10 nm.

The pad pattern 57 may be directly in contact with the channel semiconductor layer 38. The pad pattern 57 may be directly in contact with an upper end of the data storage structure 46*d* and an upper end of the buffer semiconductor layer 39. In an example embodiment, an upper surface of the pad pattern 57 may be coplanar with an upper surface of the channel semiconductor layer 38.

In the example embodiment, by providing the vertical structure 33*e* including the channel semiconductor layer 38 and the buffer semiconductor layer 39, distribution properties may improve.

Figure 8:
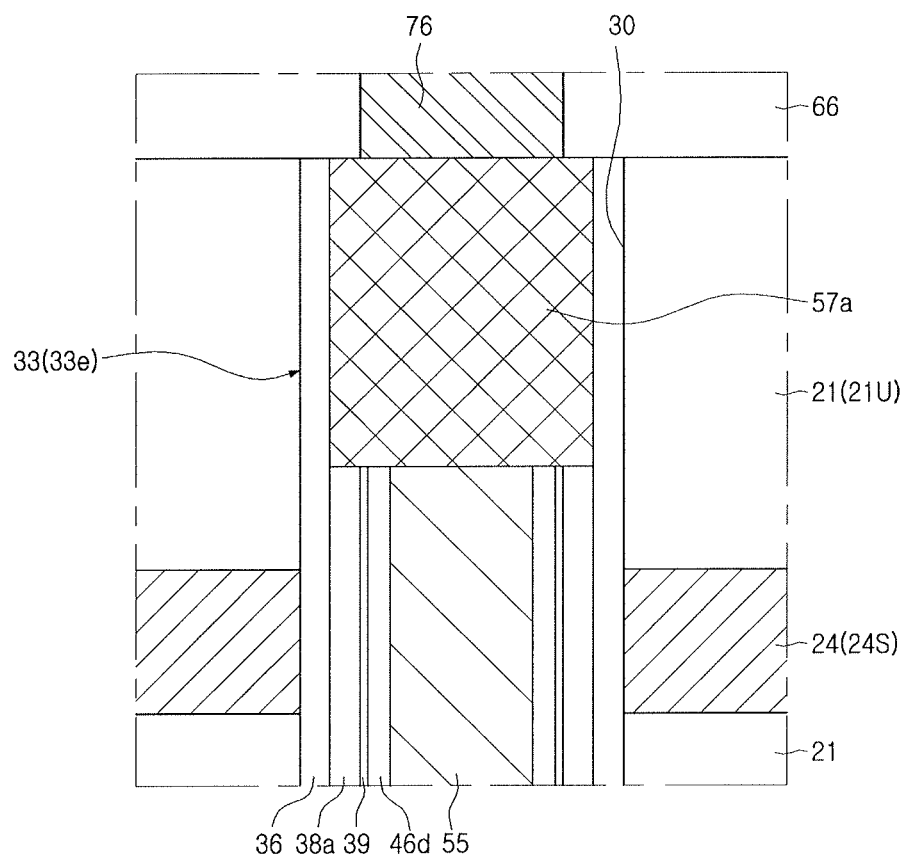
FIG. 8 illustrates a modified example of a semiconductor device corresponding to portion "C" of FIG. 7A.

In the description below, a modified example of the pad pattern described with reference to FIGS. 7A and 7C will be described with reference to FIG. 8. FIG. 8 is an enlarged diagram corresponding to the enlarged portion C in FIG. 7C.

In the modified example, referring to FIG. 8, a pad pattern 57*a* may cover an upper surface of a channel semiconductor layer 38*a*. For example, the pad pattern 57*a* may have a lower surface covering an upper end of a data storage structure 46*d* and an upper end of a buffer semiconductor layer 39 and covering an upper surface of the channel semiconductor layer 38*a*.

Figure 9:
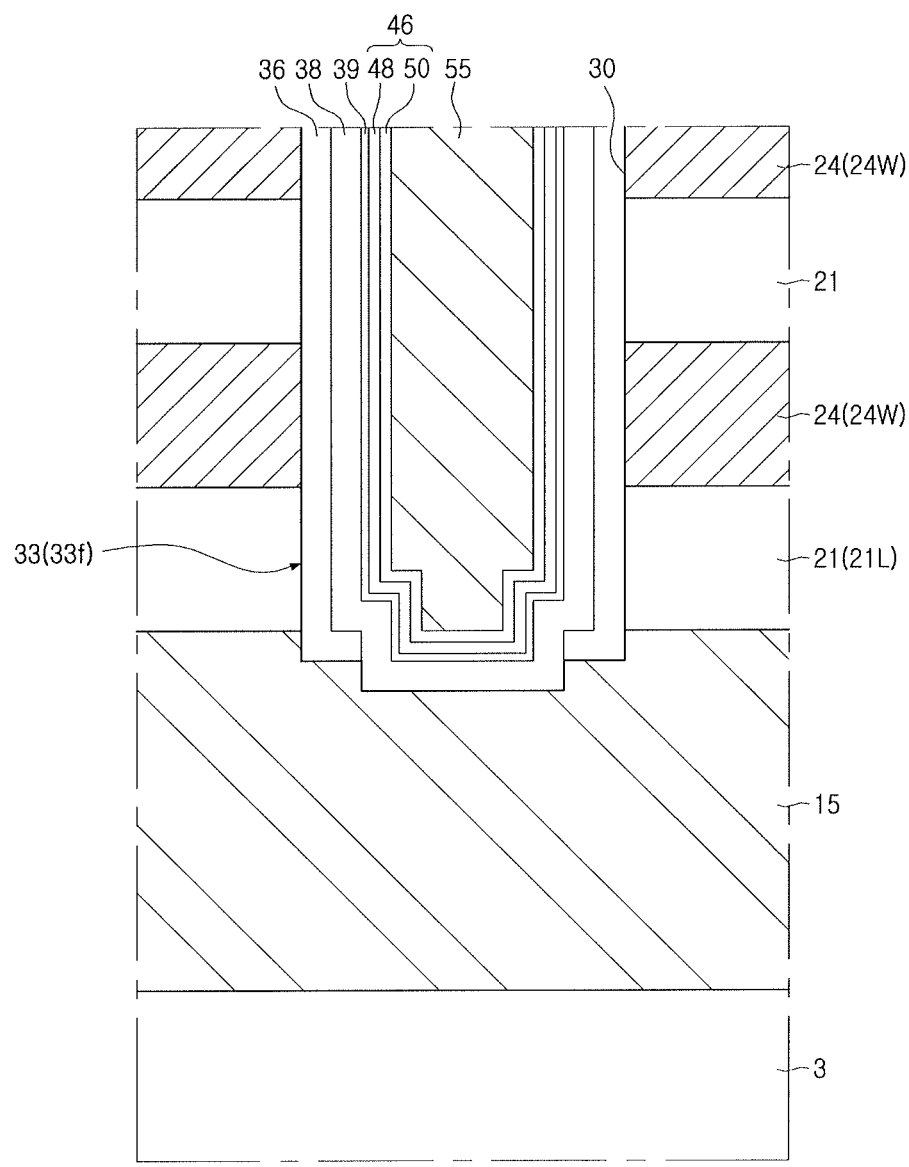
FIG. 9 illustrates a modified example of a semiconductor device corresponding to portion "B" of FIG. 7A.

In the description below, a modified example of the data storage structure described with reference to FIGS. 7A to 7C will be described with reference to FIG. 9. FIG. 9 is an enlarged diagram corresponding to the enlarged portion B in FIG. 7B.

In the modified example, referring to FIG. 9, a vertical structure 33*f* may include the data storage structure 46 along with the gate dielectric layer 36, the channel semiconductor layer 38, a buffer semiconductor layer 39, the core region 55, and the pad pattern 57 described in the aforementioned example embodiments with reference to FIGS. 7A to 7C.

The data storage structure 46 may include the first variable resistive layer 48 and the second variable resistive layer 50 illustrated in FIGS. 2A and 2B. The first variable resistive layer 48 may be in contact with the buffer semiconductor layer 39, and the second variable resistive layer 50 may be in contact with the core region 55.

In the example embodiment, by providing the vertical structure 33*f* including the channel semiconductor layer 38, the buffer semiconductor layer 39, and the data storage structure 46*b*, distribution property may improve.

Figure 10:
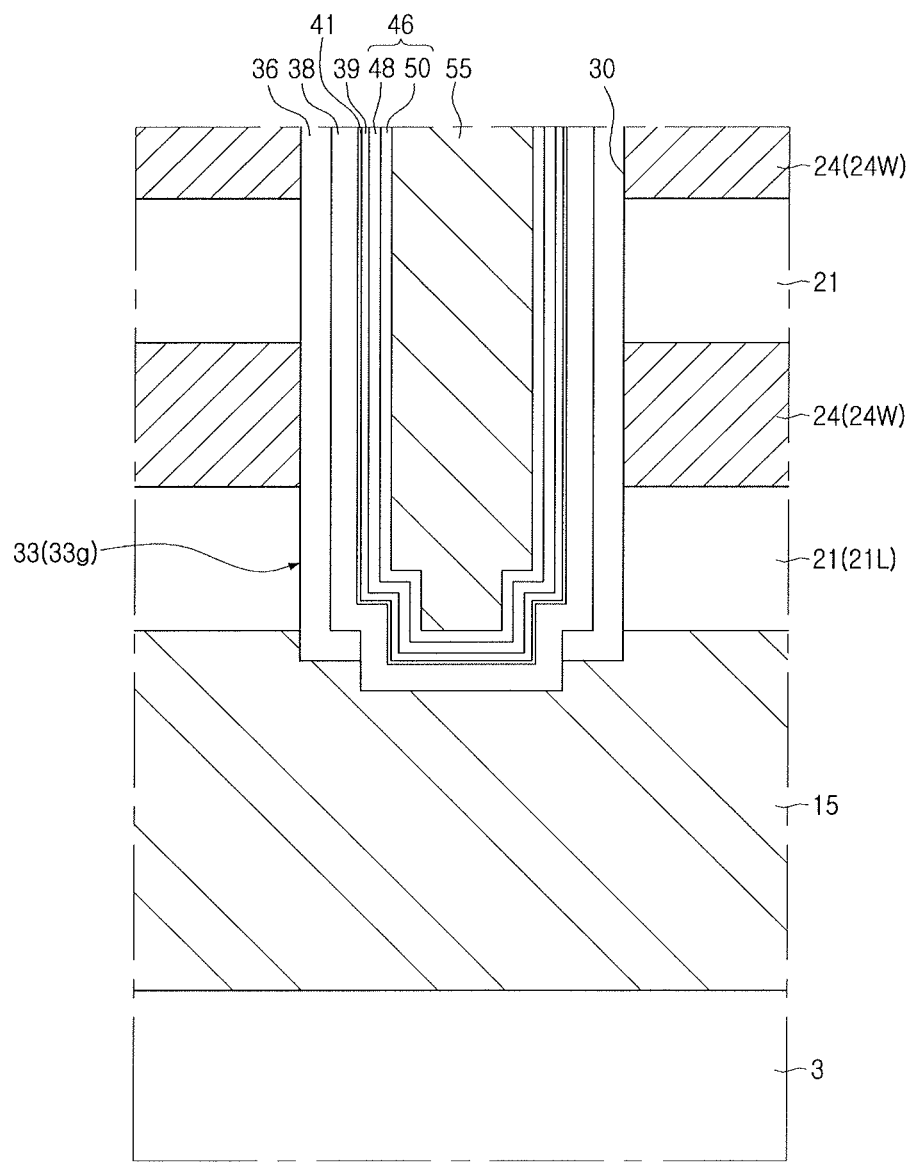
FIG. 10 illustrates another modified example of a semiconductor device corresponding to portion "B" of FIG. 7A.

In the description below, a modified example of the data storage structure described with reference to FIG. 9 will be described with reference to FIG. 10. FIG. 10 is an enlarged diagram corresponding to the enlarged diagram in FIG. 9.

In the modified example, referring to FIG. 10, a vertical structure 33*g* may further include an interfacial layer 41 along with the gate dielectric layer 36, the channel semiconductor layer 38, the buffer semiconductor layer 39, the core region 55, the pad pattern 57, and the data storage structure 46 illustrated in FIG. 9.

In an example embodiment, the data storage structure 46 may include the first variable resistive layer 48 and the second variable resistive layer 50 described with reference to FIGS. 2A and 2B. In another example embodiment, the data storage structure 46*a* may be configured as a single variable resistive layer.

The interfacial layer 41 may be formed of an oxide of the channel semiconductor layer 38 formed by oxidizing a surface of the channel semiconductor layer 38 facing the core region 55. For example, when the channel semiconductor layer 38 is formed of polysilicon, the interfacial layer 41 may be formed of a silicon oxide formed by oxidizing the polysilicon.

The interfacial layer 41 may be interposed between the channel semiconductor layer 38 and the buffer semiconductor layer 39. A thickness of the interfacial layer 41 may be less than a thickness of the data storage structure 46*b*.

In the example embodiment, by providing the vertical structure 33*g* including the channel semiconductor layer 38, the interfacial layer 41, the buffer semiconductor layer 39, and the data storage structure 46, distribution properties may improve.

Figure 11A:
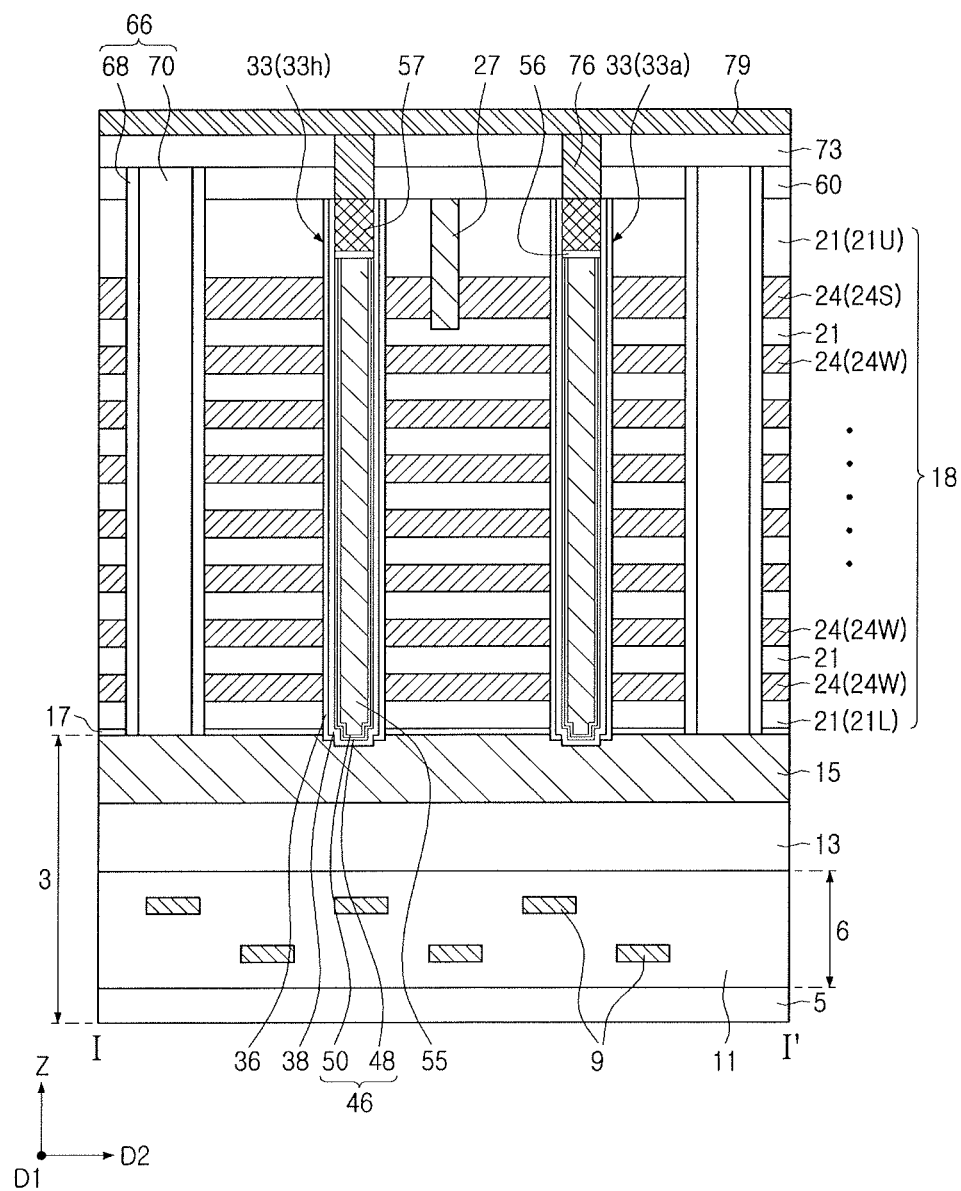
FIG. 11A illustrates a cross-sectional diagram of a semiconductor device according to another example embodiment.
Figure 11B:
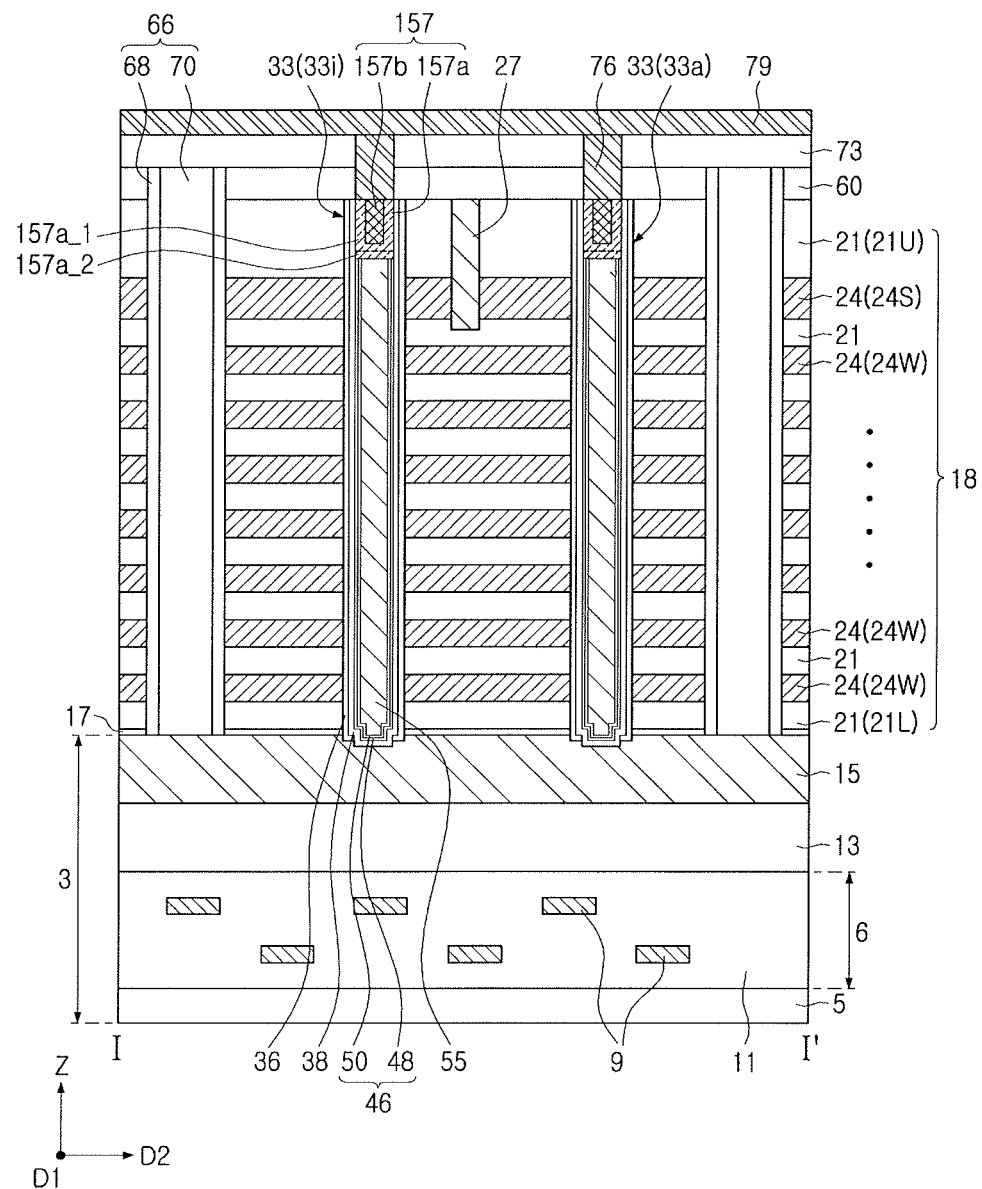
FIG. 11B illustrates a cross-sectional diagram of a semiconductor device according to another example embodiment.

In the description below, modified examples of the vertical structure described in the aforementioned example embodiment will be described with reference to FIGS. 11A and 11B. FIGS. 11A and 11B correspond to cross-sectional views along line I-I' of FIG. 1.

In the modified example, referring to FIG. 11A, a vertical structure 33*h* may further include a barrier layer 56 disposed between the pad pattern 57 and the data storage structure 46, along with the gate dielectric layer 36, the channel semiconductor layer 38, the core region 55, and the pad pattern 57. The barrier layer 56 may be interposed between the pad pattern 57 and the data storage structure 46, and may also be interposed between the core region 55 and the pad pattern 57. In an example embodiment, the barrier layer 56 may be formed of an insulating material, e.g., a silicon oxide. The barrier layer 56 may be referred to as a barrier insulating layer.

The barrier layer 56 may block a current path flowing from the pad pattern 57 to the data storage structure 46. That is, the barrier layer 56 ensures that the current path flows from the pad pattern 57 to the channel semiconductor layer 38, and only then to the data storage structure 46, i.e., without direct flow between the pad pattern 57 to the data storage structure 46, to improve control of current flow (via the channel semiconductor layer 38). Accordingly, switching property of a select transistor including the selection line 24S may improve.

In another modified example, referring to FIG. 11B, a vertical structure 33*i* may include the pad pattern 157 along with the gate dielectric layer 36, the channel semiconductor layer 38, the data storage structure 46, and the core region 55 described in the aforementioned example embodiment.

The pad pattern 157 may include a first pad layer 157*a* and a second pad layer 157*b*. The first pad layer 157*a* may cover a lower surface and a side surface of the second pad layer 157*b*. The second pad layer 157*b* may be formed of a polysilicon having N-type conductivity. A first portion 157*a*_1 of the first pad layer 157*a* adjacent to the second pad layer 157*b* may be formed of a polysilicon having N-type conductivity, and a second portion 157*a*_2 disposed below the second pad layer 157*b* and in contact with the data storage structure 46 may be formed of an undoped polysilicon. The second portion 157*a*_2 of the first pad layer 157*a* may significantly reduce a current path flowing from the pad pattern 157 to the data storage structure 46, thereby improving switching property of a select transistor including the selection line 24S.

In the description below, one or more modified examples of a semiconductor device described with reference to FIGS. 2A and 2B will be described with reference to FIGS. 12A and 12E. In the descriptions of one or more modified examples of a semiconductor device described with reference to FIGS. 12A and 12E below, mainly modified elements will be described, and the elements in FIGS. 12A and 12E which are not described in the modified examples may be understood based on the elements described in the aforementioned example embodiments.

A modified example of the stack structure described with reference to FIGS. 2A and 2B will be described with reference to FIG. 12A. FIG. 12A corresponds to a cross-sectional diagram taken along line I-I' in FIG. 1.

Figure 12A:
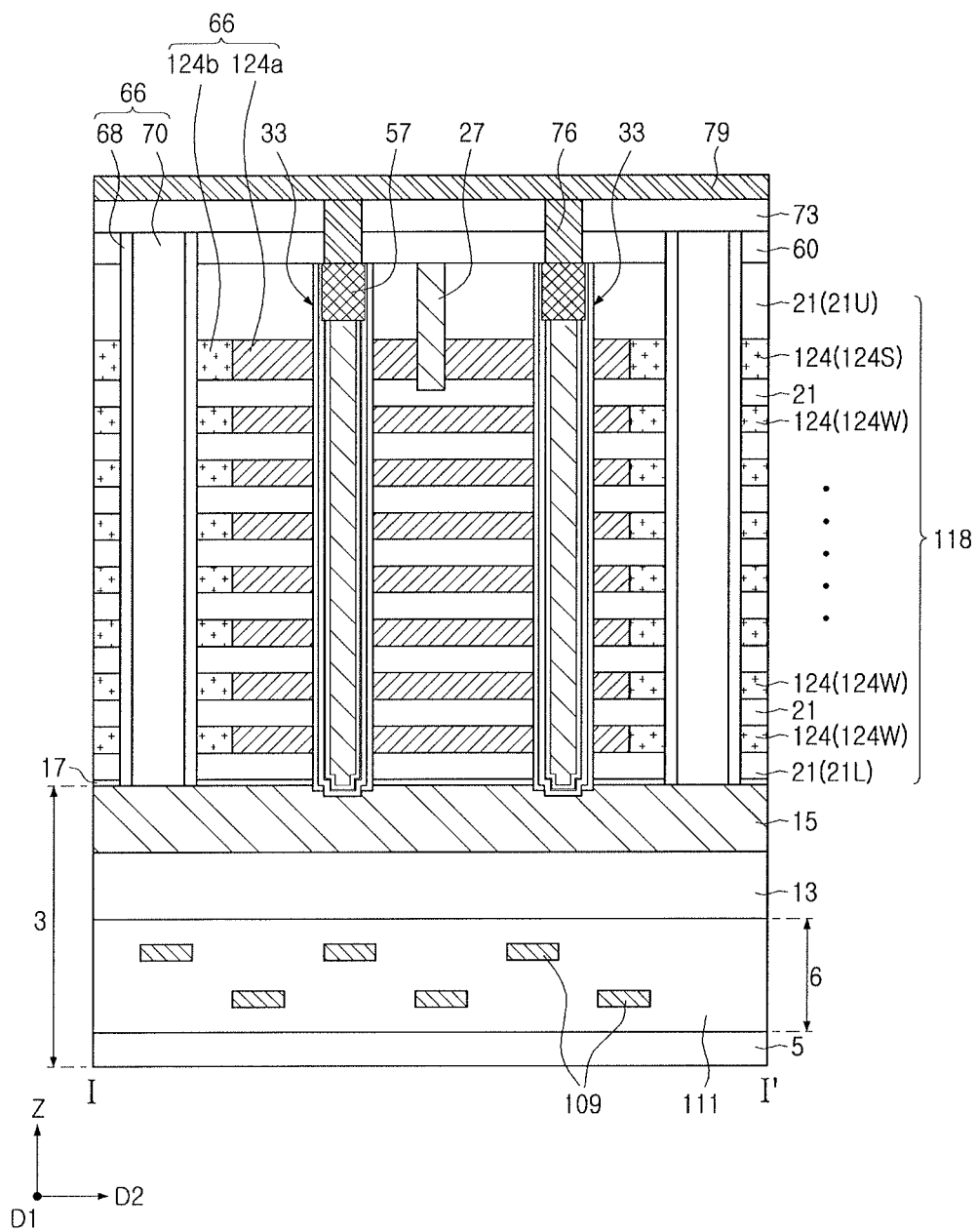
FIG. 12A illustrates a cross-sectional diagram of a semiconductor device according to another example embodiment.

In the modified example, referring to FIG. 12A, the lower buffer layer 17 may be disposed on the lower structure 3 as described above. A stack structure 118 may be disposed on the lower buffer layer 17. The stack structure 118 may include interlayer insulating layers 21 and gate electrodes 124 alternately layered. As described above, the interlayer insulating layers 21 may include a lowermost interlayer insulating layer 121L and an uppermost interlayer insulating layer 121U, and among the interlayer insulating layers 21 and the gate electrodes 124, a lowermost layer may be configured as the lowermost interlayer insulating layer 121L and an uppermost layer may be configured as the uppermost interlayer insulating layer 121U.

Separation structures 66 substantially the same as the separation structures 66 described with reference to FIG. 2A may be disposed. The separation structures 66 may penetrate the stack structure 118 and the lower buffer layer 17.

The vertical structure 33 penetrating the stack structure 118 and the lower buffer layer 17 may be disposed. A cross-sectional structure of the vertical structure 33 may be substantially the same as a cross-sectional structure of one of the vertical structures 33b, 33c, 33d, 33e, 33f, and 33g described with reference to FIGS. 2A to 7. Thus, the vertical structure 33 may be able to be replaced with one of the vertical structures 33b, 33c, 33d, 33e, 33f, and 33g described in the aforementioned example embodiments.

Each of the gate electrodes 124 may include a first gate portion 124a adjacent to the vertical structure 33, and a second gate portion 124b adjacent to the separation structures 66. The first gate portion 124a may surround a side surface of the vertical structure 33.

The first gate portion 124a may be formed of a doped polysilicon, and the second gate portion 124b may be formed of a metal silicide (e.g., WSi, TiSi, or the like), a metal nitride (e.g., WN, TiN, or the like), and/or a metal (e.g., W, or the like).

As each of the gate electrodes 124 includes the second gate portion 124b, electrical properties of the gate electrodes 124 may improve. Accordingly, a semiconductor device having improved electrical properties may be provided.

Figure 12B:
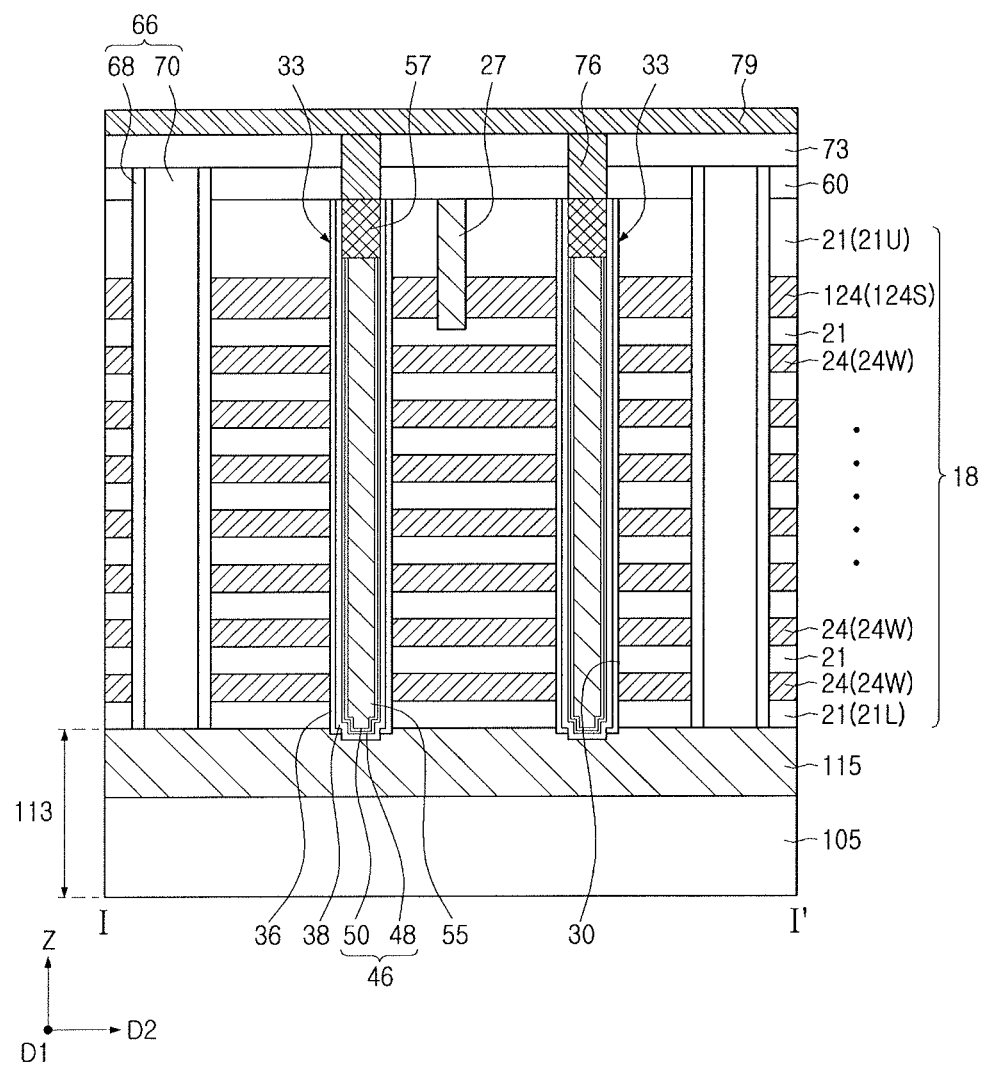
FIG. 12B illustrates a cross-sectional diagram of a semiconductor device according to another example embodiment.

In the description below, a modified example of the lower structure described with reference to FIGS. 2A and 2B will be described with reference to FIG. 12B. FIG. 12B corresponds to a cross-sectional diagram taken along line I-I' in FIG. 1.

In the modified example, referring to FIG. 12B, a lower structure 103 may include a semiconductor substrate 105 and an impurity region 115 disposed on the semiconductor substrate 105. The semiconductor substrate 105 may be configured as a single crystal silicon substrate. The impurity region 115 may be formed by doping a single crystal silicon substrate to be an N-type. Accordingly, the impurity region 115 may have N-type conductivity.

Figure 12C:
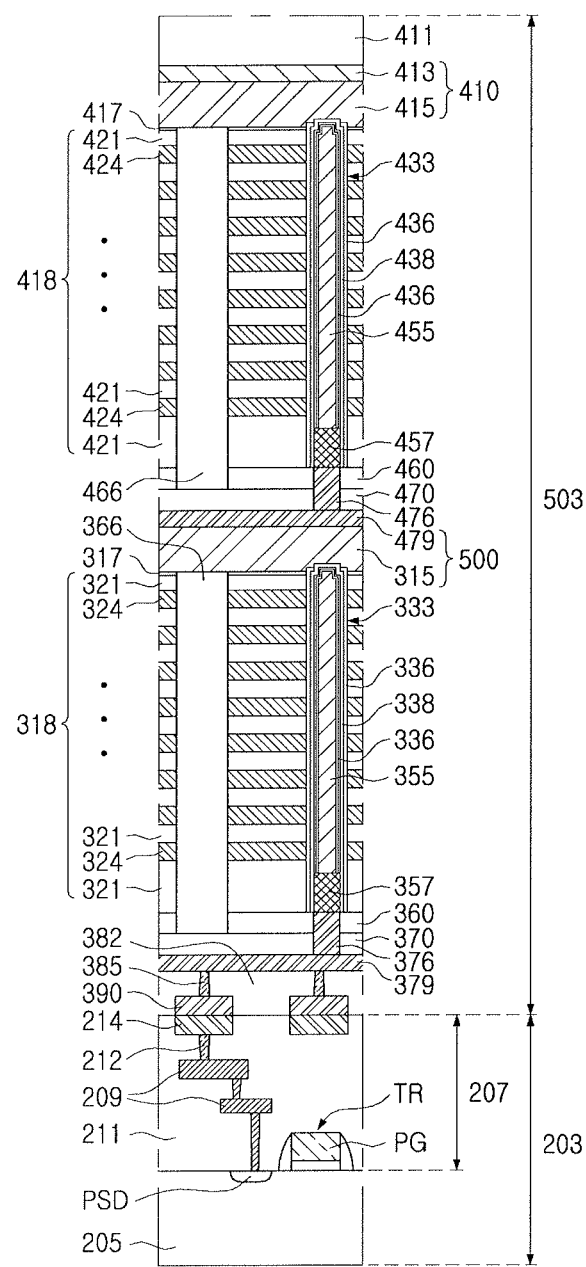
FIG. 12C illustrates a cross-sectional diagram of a semiconductor device according to another example embodiment.

A modified example of a semiconductor device will be described in accordance with an example embodiment with reference to FIG. 12C. FIG. 12C is a cross-sectional diagram illustrating a modified example of a semiconductor device.

Referring to FIG. 12C, a first chip region 203, and a second chip region 503 disposed on the first chip region 203 may be disposed. The first chip region 203 may include a base substrate 205, and a peripheral circuit structure 207 disposed on the base substrate 205. The peripheral circuit structure 207 may include a peripheral transistor PTR and a peripheral wire 209 included in a peripheral circuit, a base insulating layer 211 covering the peripheral transistor PTR and the peripheral wire 209, and a base bonding pad 214 disposed in the base insulating layer 211 and electrically connected to the peripheral wire 209. The peripheral transistor PTR may include a peripheral gate PG and a peripheral source/drain PSD. The base bonding pad 214 and the base insulating layer 211 may have upper surfaces coplanar with each other. The base bonding pad 214 and the peripheral wire 209 may be electrically connected to each other by a base plug 212.

The second chip region 503 may include a plurality of stack structures 318 and 418 and a plurality of vertical structure 333 and 433 stacked in order. Each of the plurality of stack structures 318 and 418 may be substantially the same as the stack structure 18 illustrated in FIG. 2A. For example, the plurality of stack structures 318 and 418 may include the first stack structure 318, and the second stack structure 418 disposed on the first stack structure 318. The first stack structure 318 may include first interlayer insulating layers 321 and a plurality of first gate electrodes 324 alternately stacked. The second stack structure 418 may include second interlayer insulating layers 421 and a plurality of second gate electrodes 424 alternately stacked.

The second chip region 503 may include a first conductive structure 379 disposed between the first stack structure 318 and the first chip region 203, a second conductive structure 500 disposed between the first stack structure 318 and the second stack structure 418, and a third conductive structure 410 disposed on the second stack structure 418.

The first conductive structure 379 may be formed of a metal material, e.g., tungsten, copper, or the like. The second conductive structure 500 may include a first conductive layer 315 adjacent to the first stack structure 318, and a second conductive layer 479 adjacent to the second stack structure 418. The third conductive structure 410 may include a third conductive layer 415 adjacent to the second stack structure 418 and a fourth conductive layer 413 disposed on the third conductive layer 415. The first conductive layer 315 and the third conductive layer 415 may be formed of a polysilicon having N-type conductivity. The second conductive layer 479 and the fourth conductive layer 413 may be formed of a metallic material, e.g., tungsten and/or a tungsten silicide, or the like.

The second chip region 503 may further include an insulating layer 411 disposed on the third conductive structure 410. The second chip region 503 may further include a contact insulating layer 382 in contact with and combined with the base insulating layer 211 of the first chip region 203 between the first chip region 203 and the first conductive structure 379, a chip bonding pad 390 disposed in the contact insulating layer 382 and in contact with and combined with the base bonding pad 214, and a via 385 disposed in the contact insulating layer 382 and electrically connecting the chip bonding pad 390 and the first conductive structure 379.

The second chip region 503 may further include a first upper insulating layer 360 disposed between the first stack structure 318 and the first conductive structure 379, a second upper insulating layer 370 disposed between the first upper insulating layer 360 and the first conductive structure 379, and a first buffer layer 317 disposed between the first stack structure 318 and the second conductive structure 500.

The second chip region 503 may further include a third upper insulating layer 460 disposed between the second stack structure 418 and the second conductive structure 500, a fourth upper insulating layer 470 disposed between the third upper insulating layer 460 and the second conductive structure 500, and a second buffer layer 417 disposed between the second stack structure 418 and the third conductive structure 410.

The plurality of vertical structures 333 and 433 may include the first vertical structure 333 penetrating the first stack structure 318 and the first buffer layer 317 and electrically connected to the second conductive structure 500, and a second vertical structure 433 penetrating the second stack structure 418 and the second buffer layer 417 and electrically connected to the third conductive structure 410.

Each of the plurality of vertical structures 333 and 433 may have the same structure as the structure of one of the vertical structures 33 described with reference to FIGS. 1 to 11B. For example, when a semiconductor device including the second chip region 503 rotates by 180 degrees, each of the first and second vertical structures 333 and 433 in the second chip region 503 may have the same structure as the structure of the vertical structure 33 illustrated in FIG. 2A. For example, each of the first and second vertical structures 333 and 433 may include gate dielectric layers 336 and 436, channel semiconductor layers 338 and 438, data storage structures 346 and 446, core regions 355 and 455, and pad patterns 357 and 457, corresponding to the gate dielectric layer 36 (in FIG. 2A), the channel semiconductor layer 38 (in FIG. 2A), the data storage structure 46 (in FIG. 2A), the core region 55 (in FIG. 2A), and the pad pattern 57 (in FIG. 2A), respectively.

The pad pattern 357 of the first vertical structure 333 may be electrically connected to the first conductive structure 379 by a contact plug 376 penetrating the first and second upper insulating layers 360 and 370. The pad pattern 357 of the first vertical structure 333 may be formed of a polysilicon having N-type conductivity.

The channel semiconductor layer 338 of the first vertical structure 333 may be electrically connected to the first conductive layer 315 of the second conductive structure 500, and the pad pattern 457 of the second vertical structure 433 may be electrically connected to the second conductive layer 479 of the second conductive structure 500 by a contact plug 476 penetrating the third and fourth upper insulating layers 460 and 470. A plurality of the second conductive structures 500 may be provided.

The channel semiconductor layer 438 of the second vertical structure 433 may be electrically connected to the third conductive layer 415 of the third conductive structure 410.

The first conductive structure 379 may be configured as a first common source line, the second conductive structure 500 may be configured as a bit line, and the third conductive structure 410 may be configured as a second common line. Accordingly, the second conductive structure 500, a bit line, may be disposed between the first vertical structure 333 and the second vertical structure 433. By disposing the first and second vertical structures 333 and 433 in a vertical direction, and disposing the second conductive structure 500, a bit line, between the first and second vertical structures 333 and 433, integration density of the semiconductor device may improve.

Figure 12D:
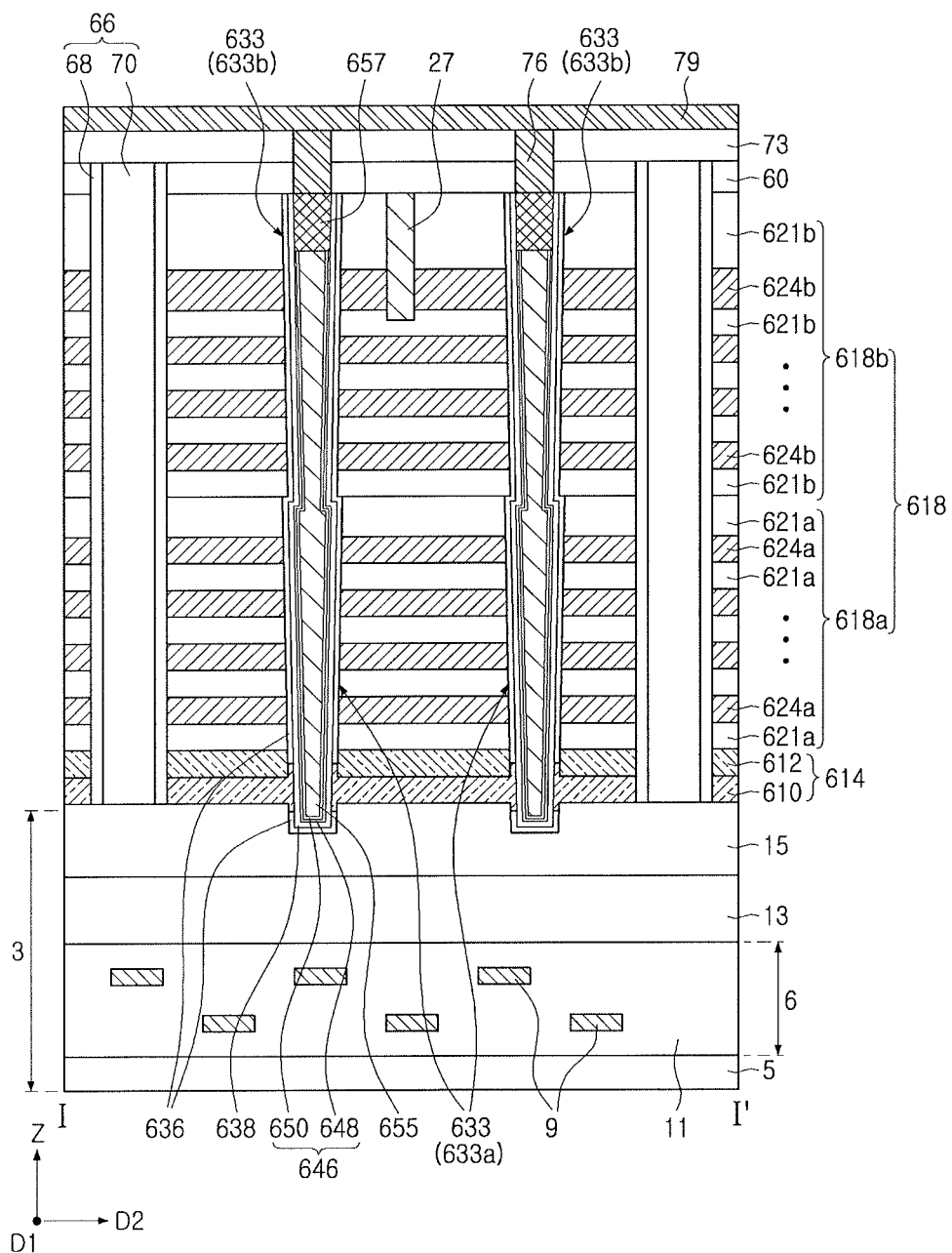
FIG. 12D illustrates a cross-sectional diagram of a semiconductor device according to another example embodiment.

Referring to FIG. 12D, a modified example of a semiconductor device will be described. FIG. 12D is a cross-sectional diagram illustrating a modified example of a semiconductor device.

Referring to FIGS. 1 and 21D, the lower structure 3 illustrated in FIG. 2A may be provided. In another example, the lower structure 3 may be replaced with a semiconductor substrate.

A horizontal structure 614 may be disposed on the lower structure 3. The horizontal structure 614 may include a first horizontal pattern 610 and a second horizontal pattern 612 on the first horizontal pattern 610.

In an example embodiment, the horizontal structure 614 may be formed of polysilicon. For example, each of the first horizontal pattern 610 and the second horizontal pattern 612 may be formed of polysilicon.

In an example embodiment, at least one of the first horizontal pattern 610 and the second horizontal pattern 612 may be formed of polysilicon having N-type conductivity. For example, the first and second horizontal patterns 610 and 612 may be formed of polysilicon having N-type conductivity.

A stack structure 618 may be disposed on the horizontal structure 614. The stack structure 618 may include a first group 618a and a second group 618b on the first group 618a.

The first group 618a may include first interlayer insulating layers 621a and first gate layers 624a alternately layered. A lowermost layer of the first interlayer insulating layers 621a and first gate layers 624a may be a lowermost first interlayer insulating layer, and an uppermost layer may be an uppermost first interlay insulating layer.

The second group 618b may include second interlayer insulating layers 621b and second gate layers 624b. A lowermost layer of the second interlayer insulating layers 621b and the second gate layers 624b may be a lowermost second interlayer insulating layer, and an uppermost layer may be an uppermost second interlayer insulating layer. The insulating pattern 27, the substantially same as in FIG. 2B, may be disposed. For example, the insulating pattern 27 may penetrate through a second gate layer working as a selection line of the second gate layers 624b.

Vertical structures 633 penetrating the stack structure 618 may be disposed. Each of the vertical structures 633 may include a lower portion 633a penetrating the first group 618a of the stack structure 618 and an upper portion 633b penetrating the second group 618b of the stack structure 618 on the lower portion 633a. In an example embodiment, an upper region of the lower portion 633a adjacent to the upper portion 633b may have a width greater than a width of a lower region of the upper portion 633b adjacent to the lower portion 633a.

Each of the vertical structures 633 may include a gate dielectric layer 636, a core region 655, a data storage structure 646, a channel semiconductor layer 638, and a pad pattern 657.

The core region 655 may extend in a vertical direction Z perpendicular to an upper surface of the lower structure 3 and may penetrate at least the first and second gate layers 624a and 624b. The pad pattern 657 may be disposed on the core region 655. The channel semiconductor layer 638 may cover a lower surface and a side surface of the core region 655 and may extend to a side surface of the pad pattern 657. The channel semiconductor layer 638 may be directly in contact with the pad pattern 657. The data storage structure 646 may be interposed between the channel semiconductor layer 638 and the core region 655, and may be disposed below the pad pattern 657. The data storage structure 646 may include a first variable resistive layer 648 and a second variable resistive layer 650 having different vacancy concentrations. The gate dielectric layer 636 may surround an external side surface of the channel semiconductor layer 638. Further, the gate dielectric layer 636 may cover a bottom surface of the channel semiconductor layer 638.

At least a portion of the horizontal structure 614 may penetrate the gate dielectric layer 636 and may be in contact with the channel semiconductor layer 638. For example, the first horizontal pattern 610 of the horizontal structure 614 may penetrate the gate dielectric layer 636 and may be in contact with the channel semiconductor layer 638.

In the vertical structures 633, the channel semiconductor layer 638, the data storage structure 646, and the core region 655 may correspond to the channel semiconductor layer 38 (in FIGS. 2A and 2B), the data storage structure 46 (in FIGS. 2A and 2B), and the core region 55 (in FIGS. 2A and 2B), respectively. However, an example embodiment thereof is not limited thereto, and the vertical structures 633 may be modified as in the example embodiment described with reference to FIGS. 5A to 11B. For example, each of the vertical structures 633 may include the first and second additional variable resistive layers 52a and 52b (in FIG. 6A) described with reference to FIG. 6A. As another example, each of the vertical structures 633 may further include the buffer semiconductor layer 39 (in FIGS. 7A to 9) described with reference to FIGS. 7A to 9. In this case, in each of the vertical structures 633, the buffer semiconductor layer 39 (in FIGS. 7A to 9) described in the example embodiment may be interposed between the channel semiconductor layer 638 and the data storage structure 646. As another example, each of the vertical structures 633 may further include the buffer semiconductor layer 39 (in FIG. 10) and the interfacial layer 41 (in FIG. 10) described with reference to FIG. 10. As another example, each of the vertical structures 633 may further include the isolation layer 56 (in FIG. 11A) described with reference to FIG. 11A.

In the description below, a modified example of the semiconductor device will be described with reference to FIG. 12E. FIG. 12E is a cross-sectional diagram illustrating a modified example of the semiconductor device.

Figure 12E:
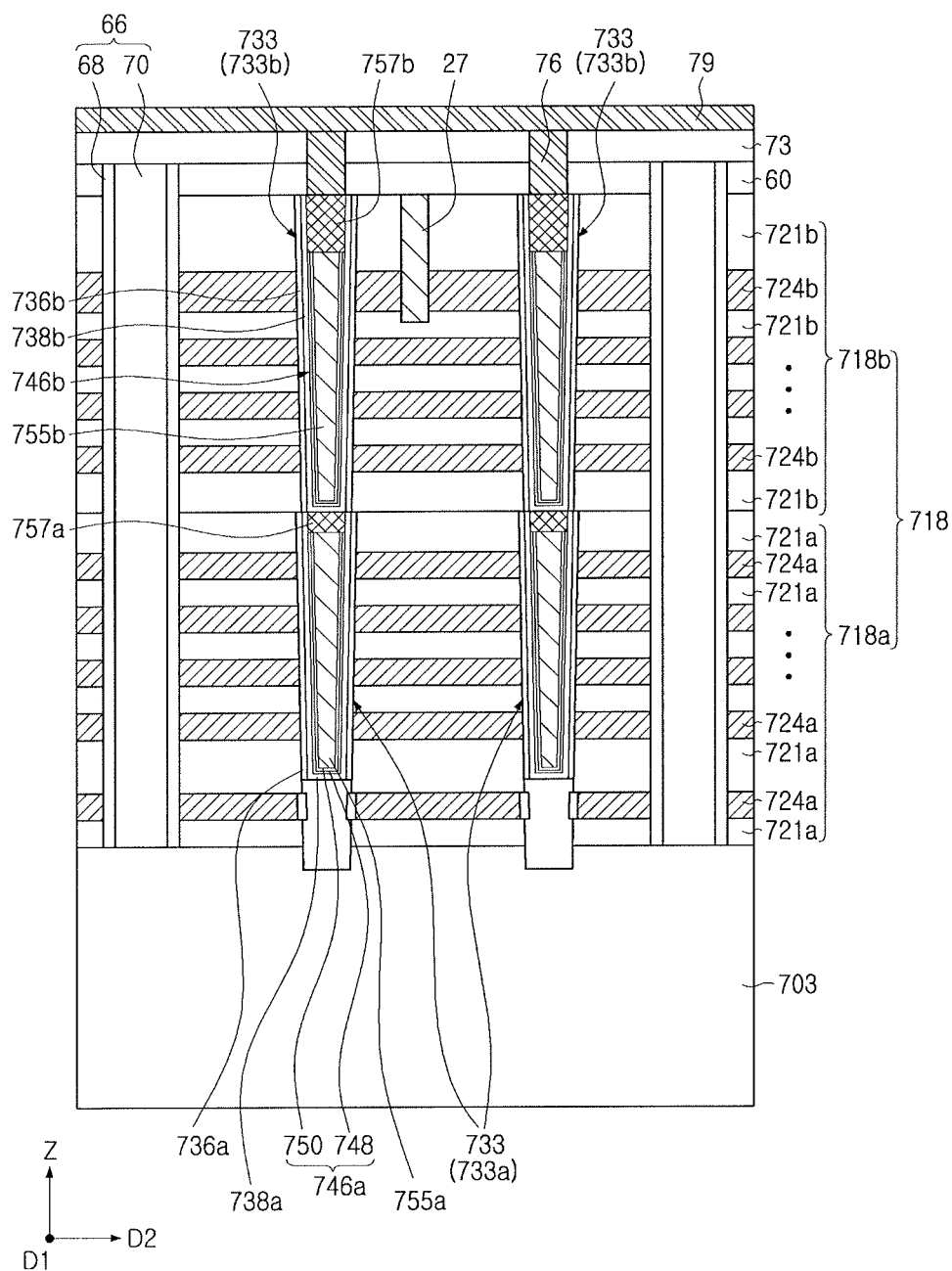
FIG. 12E illustrates a cross-sectional diagram of a semiconductor device according to another example embodiment.

Referring to FIGS. 1 and 12E, a stack structure 718 may be disposed on a lower structure 703. The lower structure 703 may be the lower structure 3 (in FIG. 2A) illustrated in FIG. 2A. The stack structure 718 may include a first group 718a and a second group 718b on the first group 718a. The first group 718a may include first interlayer insulating layers 721a and first gate layers 724a alternately layered. A lowermost layer of the first interlayer insulating layers 721a and the first gate layers 724a may be a lowermost first interlayer insulating layer, and an uppermost layer may be an uppermost first interlayer insulating layer. The second group 718b may include second interlayer insulating layers 721b and second gate layers 724b alternately layered. A lowermost layer of the second interlayer insulating layers 721b and the second gate layers 724b may be a lowermost second interlayer insulating layer, and an uppermost layer may be an uppermost second interlayer insulating layer. The insulating pattern 27, the substantially same as in FIG. 2B, may be disposed. For example, the insulating pattern 27 may penetrate through a second gate layer working as a selection line of the second gate layers 724b.

Vertical structures 733 penetrating the stack structure 718 may be disposed. Each of the vertical structures 733 may include a lower portion 733a penetrating the first group 718a of the stack structure 718 and an upper portion 733b penetrating the second group 718b of the stack structure 718 on the lower portion 733a.

In an example embodiment, an upper region of the lower portion 733a adjacent to the upper portion 733b may have a width greater than a width of a lower region of the upper portion 733b adjacent to the lower portion 733a.

The lower portion 733a of the vertical structure 733 may include a semiconductor pattern 716, a first gate dielectric layer 736a disposed on the semiconductor pattern 716, a first core region 755a, a first data storage structure 746a, a first channel semiconductor layer 738a, and a first pad pattern 757a.

In the lower portion 733a of the vertical structure 733, the semiconductor pattern 716 may penetrate a lowermost first gate layer of the first gate layers 724a, the first core region 755a may extend in the vertical direction Z on the semiconductor pattern 716 and may penetrate the other first gate layers of the first gate layers 724a, the first pad pattern 757a may be disposed on the first core region 755a, the first channel semiconductor layer 738a may cover a lower surface and a side surface of the first core region 755a and may extend to a side surface of the first pad pattern 757a, the first data storage structure 746a may be interposed between the first channel semiconductor layer 738a and the first core region 755a and may be disposed below the first pad pattern 757a, and the first gate dielectric layer 736a may surround an external side surface of the first channel semiconductor layer 738a. The first data storage structure 746a may include a first variable resistive layer 748 and a second variable resistive layer 750 having difference vacancy concentrations.

In an example, the semiconductor pattern 716 may be an epitaxial silicon layer epitaxially grown from the substrate 703.

In an example, a lower gate dielectric layer 717 may be disposed between a lowermost first gate layer of the first gate layers 724a and the semiconductor pattern 716.

In an example, the first channel semiconductor layer 738a may be in contact with the semiconductor pattern 716.

In another example, the semiconductor pattern 716 may not be provided. When the semiconductor pattern 716 is not provided, the first channel semiconductor layer 738a may extend downwardly and may be in contact with the substrate 703.

In the upper portion 733b of the vertical structures 733, a second core region 755b may extend in the vertical direction Z on the first pad pattern 757a and may penetrate the second gate layers 724b, a second pad pattern 757b may be disposed on the second core region 755b, a second channel semiconductor layer 738b may cover a lower surface and a side surface of the second core region 755b and may extend to a side surface of the second pad pattern 757b, a second data storage structure 746b may be interposed between the second channel semiconductor layer 738b and the second core region 755b and may be disposed below the second pad pattern 757b, and a second gate dielectric layer 736b may surround an external side surface of the second channel semiconductor layer 738b. The second data storage structure 746b may be formed of the same material as a material of the first data storage structure 746a.

In the vertical structures 733, the first and second channel semiconductor layers 738a and 738b, the first and second data storage structure 746a and 746b, and the first and second core regions 755a and 755b may correspond to the channel semiconductor layer 38 (in FIGS. 2A and 2B), the data storage structure 46 (in FIGS. 2A and 2B), and the core region 55 (in FIGS. 2A and 2B) described with reference to FIGS. 2A and 2B, respectively. However, an example embodiment thereof is not limited thereto, and each of the lower portion 733a and the upper portion 733b of the vertical structures 733 may be modified as in the aforementioned example embodiment described with reference to FIGS. 5A to 11B.

Figure 13:
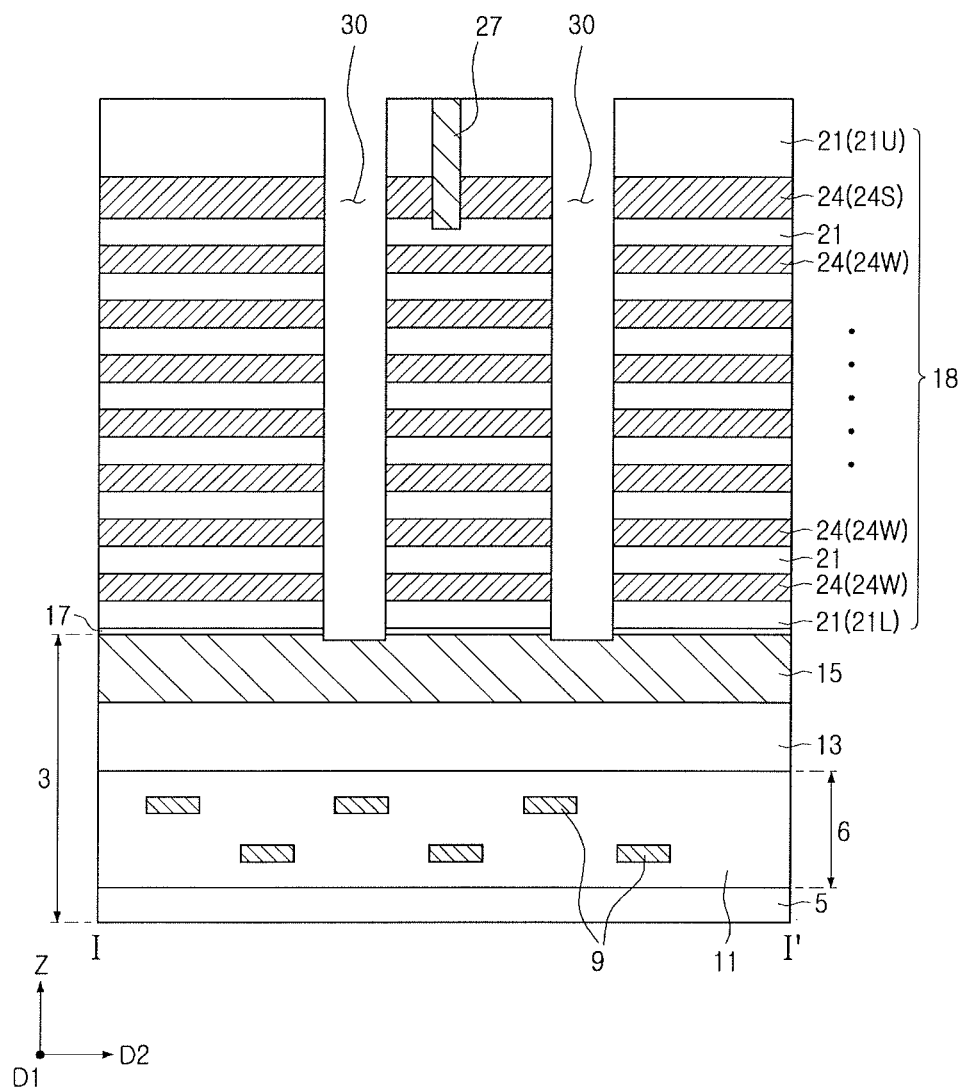
FIGS. 13, 14A, and 15 illustrate cross-sectional diagrams of stages in a method of manufacturing a semiconductor device according to an example embodiment.

In the description below, a method of manufacturing a semiconductor device will be described in accordance with an example embodiment with reference to FIGS. 13 to 15. FIGS. 13, 14A, and 15 are cross-sectional diagrams illustrating a region taken along line I-I' in FIG. 1. FIGS. 14B and 14C are schematic diagrams of stages in methods of forming the data storage structure 46 according to example embodiments.

Referring to FIGS. 1 to 13, the lower buffer layer 17 and the stack structure 18 may be formed on the lower structure 3 in order. Forming the lower structure 3 may include forming the peripheral circuit region 6 on the lower base 5, followed by forming the upper base 13 and the impurity region 15 on the peripheral circuit region 6 in order. The peripheral circuit region 6 may include the peripheral wires 9 and the lower insulating layer 11 covering, e.g., embedding, the peripheral wires 9. The lower base 5 may be implemented as a single crystal silicon substrate, and the upper base 13 may be formed of, e.g., metal, metal silicide, or polysilicon.

In another example embodiment, forming the lower structure 3 may include forming the impurity region 115 (in FIG. 12B), e.g., directly, on the semiconductor substrate 105 (in FIG. 12B) as illustrated in FIG. 12B.

Forming the stack structure 18 may include alternately and repeatedly forming the interlayer insulating layers 21 and the gate electrodes 24. The interlayer insulating layers 21 may include the lowermost interlayer insulating layer 21L and the uppermost interlayer insulating layer 21U. Among the interlayer insulating layers 21 and the gate electrodes 24, a lowermost layer may be configured as the lowermost interlayer insulating layer 21L, and an uppermost layer may be configured as the uppermost interlayer insulating layer 21U. The insulating pattern 27 penetrating the uppermost interlayer insulating layer 21U and extending downwardly, and penetrating the upper gate electrode 24 of the gate electrodes 24, e.g., the at least one selection line 24S, may be formed. The insulating pattern 27 may be formed of, e.g., a silicon oxide.

The hole 30 penetrating the stack structure 18 and the lower buffer layer 17 may be formed. Forming the hole 30 may include exposing the lower buffer layer 17 by etching the stack structure 18, and exposing the lower structure 3 by etching the lower buffer layer 17.

Referring to FIGS. 1 to 14A, the vertical structure 33 may be formed in the hole 30. The vertical structure 33 may be formed as one of the vertical structures 33 to 33i described with reference to FIGS. 2A to 11B. For example, the vertical structure 33 may be formed as described with reference to FIGS. 2A and 2B. For instance, forming the vertical structure 33 may include forming the gate dielectric layer 36 on a side wall of the hole 30, forming the channel semiconductor layer 38 covering the gate dielectric layer 36 in the hole 30 and in contact with the impurity region 15, forming the data storage structure 46 covering the channel semiconductor layer 38 in the hole 30, forming the core region 55 filling a portion of the hole 30, and forming the pad pattern 57 on top of the core region 55 to completely fill the hole 30.

Forming the data storage structure 46 may include forming the first variable resistive layer 48 and the second variable resistive layer 50 described with reference to FIGS. 2A and 2B in order. That is, examples of formation of the variable resistive material of the data storage structure 46 will be described below with reference to FIGS. 14B and 14C.

For example, referring to FIG. 14B, a first transition metal, e.g., Hf, may be deposited, e.g., via atomic layer deposition (ALD), on the channel semiconductor layer 38 to form a first transition metal layer 44, followed by deposition, e.g., via ALD, of a mixture of oxygen and an additional gas, e.g., hydrogen gas or nitrogen gas, on the deposited first transition metal layer 44 to form a mixture layer 47a. Deposition of the first transition metal layer 44 and the mixture layer 47a may be repeated multiple times, e.g., at least three cycles of ALD may be performed to deposit a total of at least three transition metal layers 44 alternating with three mixture layers 47a. As illustrated in FIG. 14B, the amount of the additional gas, e.g., hydrogen gas, may be increased relative to the amount of the oxygen during each deposition cycle, such that the mount of additional gas, e.g., hydrogen gas, may gradually increase in each additional deposited mixture layer 47a. For example, referring to FIG. 14B, in the first deposition cycle, the amount of oxygen in the deposited mixture may be larger than that of the hydrogen, while in the last deposition cycle, the amount of hydrogen in the deposited mixture may be larger than that of the oxygen.

Once the first transition metal layers 44 and the mixture layers 47a are deposited, the first transition metal layers 44 and the mixture layers 47a are treated to remove the additional gas, such that vacancies 45 are formed, e.g., remain, instead of the removed atoms of the additional gas. As the amount of the additional gas is increased in each deposition cycle, as the distance from the channel semiconductor layer 38 increases, the amount of resultant vacancies after treatment also increases, as the distance from the channel semiconductor layer 38 increases. Therefore, the increased concentration of vacancies that increases, as the distance from the channel semiconductor layer 38 increases, refers to the increased amount of vacancies in the resultant material after removal of the atoms of the additional gas.

For example, if the additional gas is hydrogen, the first transition metal layers 44 and the mixture layers 47a are treated with chlorine to remove hydrogen atoms from the mixture layers 47a, such that vacancies replace the removed hydrogen atoms. Then, the resultant mixture layers 47a' with the vacancies are heated to form the data storage structure 46 on the channel semiconductor layer 38 with an increasing concertation of vacancies along a direction oriented from the channel semiconductor layer 38 toward a center of the vertical structure 33 (in FIG. 14A). Heating the mixture layers 47a' with the vacancies may include annealing, e.g., at about 650° C. for about 360 seconds or at about 1100° C. for about 1 second.

Figure 14A:
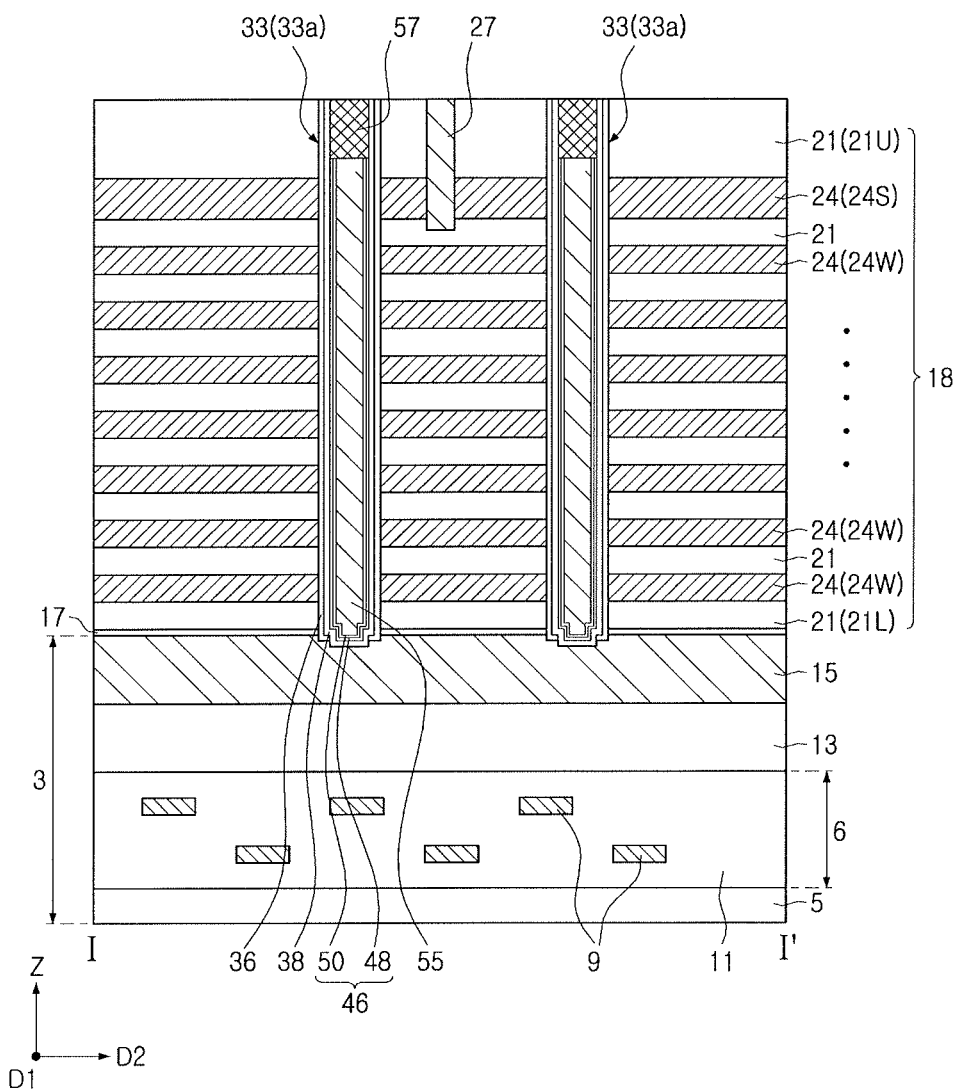
Figure 14B:
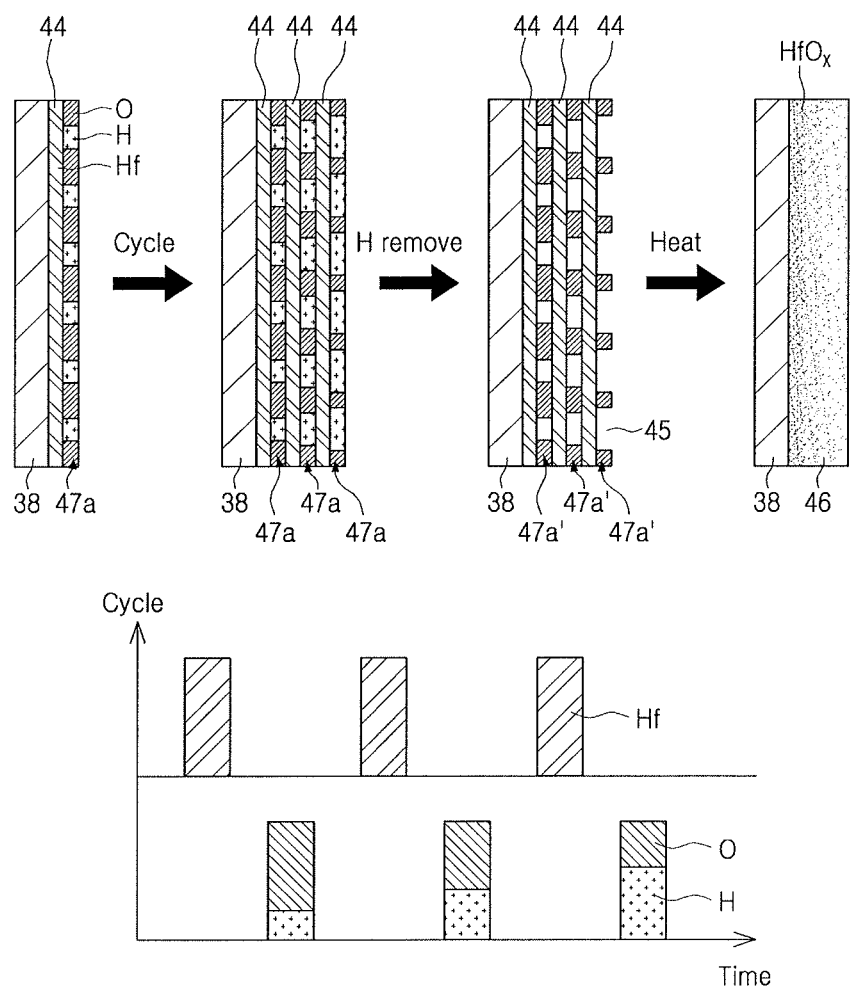
FIGS. 14B and 14C illustrate schematic diagrams of stages in methods of forming a data storage structure according to example embodiments.
Figure 14C:
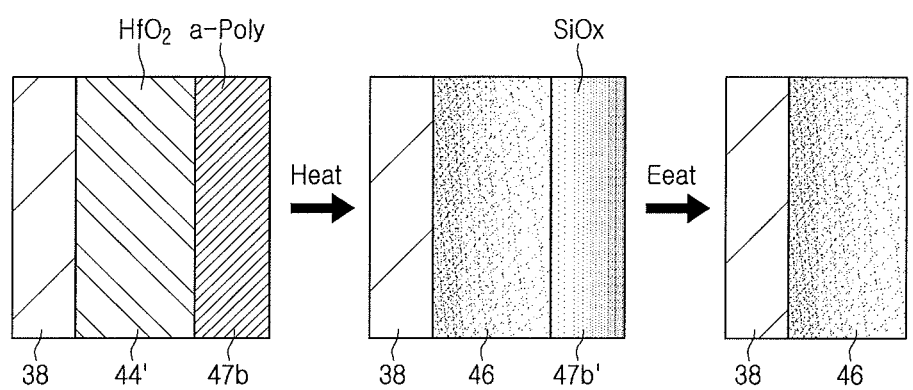
Figure 15:
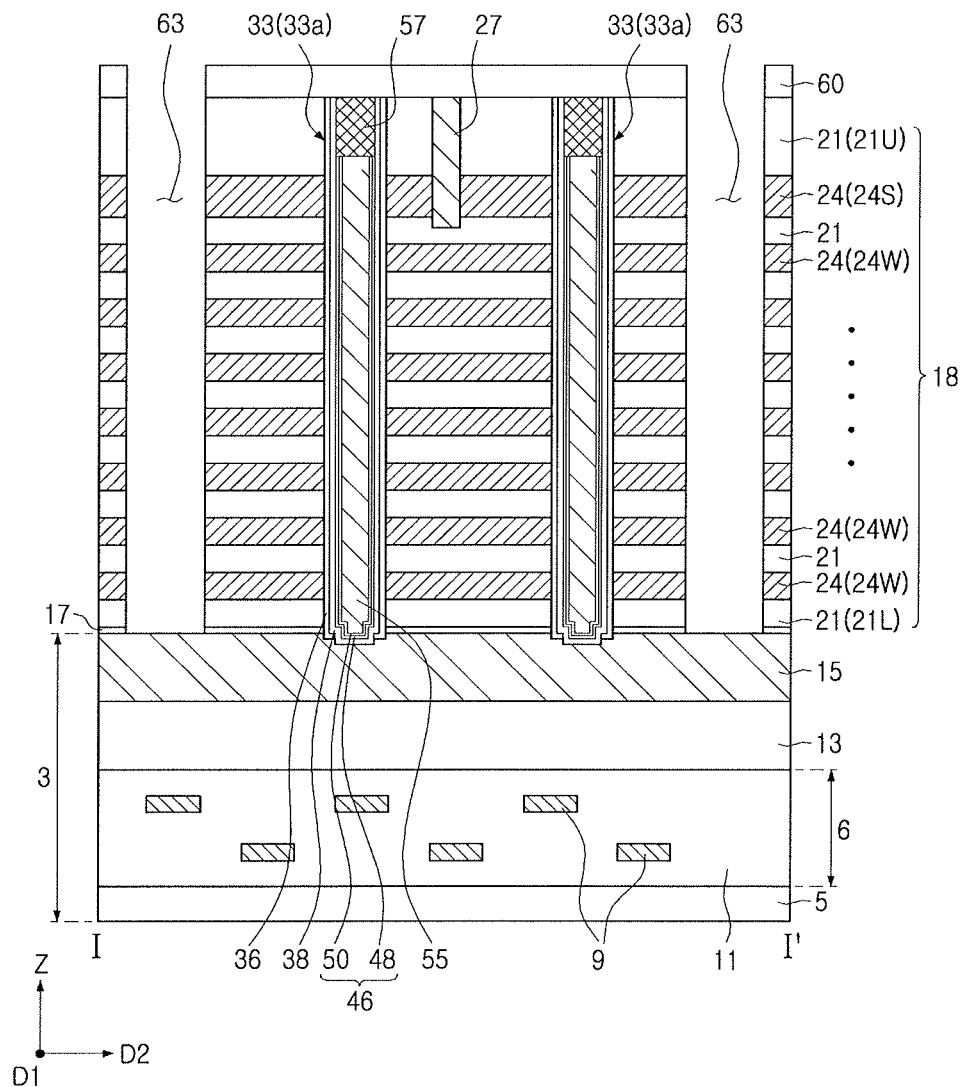

In another example, if the additional gas is nitrogen, the first transition metal layers 44 and the mixture layers 47a may be chemically processed, e.g., with phosphoric acid, to remove nitrogen atoms from the mixture layers 47a and form the data storage structure 46 on the channel semiconductor layer 38 with an increasing concertation of vacancies along a direction oriented from the channel semiconductor layer 38 toward a center of the vertical structure 33 (in FIG. 14A).

For example, the vacancy concentration in the data storage structure 46 may be adjusted by adjusting the amounts of the additional gas in the mixture layers 47*a*. For example, a deposition time of each transition metal layer 44 and mixture layer 47*a* may be controlled to adjust a concentration profile of the vacancies, e.g., a cycle length may be controlled to have a constant profile (step profile for each layer or multiple layers) or a gradually increasing profile (very short cycles with increasing concentrations that provide a gradually increasing concentration graph).

In another example, referring to FIG. 14C, a first transition metal oxide, e.g., HfO, may be deposited, e.g., via atomic layer deposition (ALD), on the channel semiconductor layer 38 to form a first transition metal oxide layer 44', followed by deposition, e.g., via ALD, of amorphous silicon layer 47*b*. Then, the resultant structure is heated, such that oxygen atoms transfer from the first transition metal oxide layer 44' into the amorphous silicon layer 47*b*. Oxygen atoms removed from the first transition metal oxide layer 44' form vacancies in the first transition metal oxide layer 44', while the amorphous silicon layer 47*b* transforms into silicon oxide 47*b'*. The silicon oxide 47*b'* is removed, e.g., completely etched away, e.g., via hydrofluoric acid, to expose the first transition metal oxide layer with vacancies, such that the resultant exposed first transition metal oxide layer with vacancies defines the data storage structure 46 on the channel semiconductor layer 38. For example, multiple cycles may be performed to gradually increase the vacancy concentration, e.g., repeated cycles of deposition, heating, and removing.

Referring to FIGS. 1 and 15, the first upper insulating layer 60 covering the vertical structure 33 and the stack structure 18 may be formed. Isolation trenches 63 penetrating the first upper insulating layer 60, the stack structure 18, and the lower buffer layer 17 may be formed.

In another example embodiment, to form the gate electrodes 124 (in FIG. 12A) described with reference to FIG. 12A, the isolation trenches 63 penetrating the stack structure 18 may be formed, recesses may be formed by partially etching the gate electrodes 24 exposed by the isolation trenches 63, the recesses may be filled with a metallic material, and the lower structure 3 may be exposed by etching the lower buffer layer 17. The partially etched gate electrodes 24 may be defined as the first gate portion 124*a* (in FIG. 12A), and the metallic material filling the recesses may be defined as the second gate portion 124*b* (in FIG. 12A).

Referring to FIGS. 1, 2A, and 2B, separation structures 66 filling the isolation trenches 63 may be formed. In an example embodiment, forming the separation structures 66 may include forming the first isolation pattern 68 covering side walls of the isolation trenches 63, and forming the second isolation pattern 70 filling each of the isolation trenches 63. The first isolation pattern 68 may be interposed between the second isolation pattern 70 and the stack structure 18. The first isolation pattern 68 may be formed of an insulating material, and the second isolation pattern 70 may be formed of a conductive material. In another example embodiment, the separation structures 66 may be formed of an insulating material.

The second upper insulating layer 73 may be formed on the separation structures 66 and the first upper insulating layer 60. The contact plug 76 penetrating the first and second upper insulating layers 60 and 73 and electrically connected to the vertical structure 33 may be formed. The conductive line 79 electrically connected to the contact plug 76 on the contact plug 76 may be formed.

According to the aforementioned example embodiments, a semiconductor device including memory cells with improved distribution property may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a lower structure including an impurity region;
a stack structure on the lower structure;
separation structures penetrating the stack structure on the lower structure;
an opening penetrating the stack structure between the separation structures;
a vertical structure in the opening;
a contact plug electrically connected to the vertical structure on the stack structure; and
a bit line electrically connected to the contact plug on the contact plug,
wherein the stack structure includes interlayer insulating layers and gate electrodes in contact with each other and alternately layered,
wherein the vertical structure includes:
a core region having insulating properties and spaced apart from a side wall of the opening,
a semiconductor layer covering a side surface and a lower surface of the core region,
a gate dielectric layer between an external side surface of the semiconductor layer and the gate electrodes,
a data storage structure interposed between the core region and the semiconductor layer, and covering the side surface and the lower surface of the core region, and
a pad pattern in contact with an upper surface of the core region,
wherein an upper end of the data storage structure overlaps the pad pattern,
wherein the impurity region and the pad pattern include a doped silicon having N-type conductivity,
wherein the contact plug is in contact with the pad pattern, and
wherein the data storage structure includes a variable resistive material layer having an oxygen vacancy.

2. The semiconductor device as claimed in claim 1, wherein the upper end of the data storage structure is in contact with the pad pattern.

3. The semiconductor device as claimed in claim 1, wherein:
the variable resistive material layer includes a first variable resistive material layer adjacent to the semiconductor layer and a second variable resistive material layer adjacent to the core region, and
an oxygen vacancy concentration of the first variable resistive material layer is higher than an oxygen vacancy concentration of the second variable resistive material layer.

4. The semiconductor device as claimed in claim 3, wherein:
- the data storage structure includes a first region having a first resistance in a set state and a second region having a second resistance in a reset state,
- the first resistance is lower than the second resistance,
- in a program operation, the data storage structure has a first boundary between the semiconductor layer and the first variable resistive material layer at which a program current starts flowing from the semiconductor layer into the first variable resistive material layer, a second boundary at which the program current starts flowing from the first variable resistive material layer into the second variable resistive material layer, a third boundary at which the program current starts flowing from the second variable resistive material layer into the first variable resistive material layer, and a fourth boundary between the first variable resistive material layer and the semiconductor layer at which the program current passes through the first variable resistive material layer and flows into the semiconductor layer,
- the first region of the data storage structure includes a first filament in the first variable resistive material layer between the first boundary and the second boundary, a second filament in the second variable resistive material layer between the second boundary and the third boundary, and a third filament in the first variable resistive material layer between the third boundary and the fourth boundary,
- the first filament, the second filament, and the third filament are connected to one another,
- in the first filament, a region of the first filament adjacent to the first boundary has an oxygen vacancy concentration higher than an oxygen vacancy concentration of a region of the first filament adjacent to the second boundary,
- in the second filament, a region of the second filament adjacent to the second boundary has an oxygen vacancy concentration higher than an oxygen vacancy concentration of a region of the second filament adjacent to the third boundary, and
- in the third filament, a region of the third filament adjacent to the third boundary has an oxygen vacancy concentration higher than an oxygen vacancy concentration of a region of the third filament adjacent to the fourth boundary.

5. The semiconductor device as claimed in claim 4, wherein:
- the second region of the data storage structure includes a first modified filament in the first variable resistive material layer between the first boundary and the second boundary, a second modified filament in the second variable resistive material layer between the second boundary and the third boundary, and a third modified filament in the first variable resistive material layer between the third boundary and the fourth boundary,
- the first modified filament is spaced apart from the second modified filament, and
- the third modified filament is spaced apart from the second modified filament.

6. The semiconductor device as claimed in claim 5, wherein:
- the first modified filament is in contact with the first boundary and is spaced apart from the second boundary,
- the second modified filament has an oxygen vacancy concentration lower than an oxygen vacancy concentration of the second filament in a region in contact with the third boundary, and
- the third modified filament is in contact with the third boundary and is spaced apart from the fourth boundary.

7. The semiconductor device as claimed in claim 3, wherein:
- the data storage structure includes a first region having a first resistance in a set state and a second region having a second resistance in a reset state,
- the first resistance is lower than the second resistance,
- in a program operation, the data storage structure has a first boundary between the semiconductor layer and the first variable resistive material layer at which a program current starts flowing from the semiconductor layer into the first variable resistive material layer, a second boundary at which the program current starts flowing from the first variable resistive material layer into the second variable resistive material layer, a third boundary at which the program current starts flowing from the second variable resistive material layer into the first variable resistive material layer, and a fourth boundary between the first variable resistive material layer and the semiconductor layer at which the program current passes through the first variable resistive material layer and flows into the semiconductor layer,
- the first region of the data storage structure includes a first filament in the first variable resistive material layer between the first boundary and the second boundary, a second filament in the second variable resistive material layer between the second boundary and the third boundary, and a third filament in the first variable resistive material layer between the third boundary and the fourth boundary,
- the first filament, the second filament, and the third filament are connected to one another,
- in the first filament, a region of the first filament adjacent to the first boundary has an oxygen vacancy concentration higher than an oxygen vacancy concentration of a region of the first filament adjacent to the second boundary, and
- in the third filament, a region of the third filament adjacent to the third boundary has an oxygen vacancy concentration higher than an oxygen vacancy concentration of a region of the third filament adjacent to the fourth boundary.

8. The semiconductor device as claimed in claim 7, wherein:
- the second region of the data storage structure includes a first modified filament in the first variable resistive material layer between the first boundary and the second boundary, a second modified filament in the second variable resistive material layer between the second boundary and the third boundary, and a third modified filament in the first variable resistive material layer between the third boundary and the fourth boundary,
- the first modified filament and the third modified filament are in contact with the second modified filament,
- the first modified filament is spaced apart from the first boundary, and
- the third modified filament is spaced apart from the fourth boundary.

9. The semiconductor device as claimed in claim 3, further comprising at least one additional variable resistive material layer between the first variable resistive material layer and the second variable resistive material layer, an oxygen vacancy concentration of the at least one additional variable resistive material layers being higher than the oxygen vacancy concentration of the first variable resistive material layer and lower than the oxygen vacancy concentration of the second variable resistive material layer.

10. The semiconductor device as claimed in claim 3, wherein:
the first variable resistive material layer has the oxygen vacancy concentration decreasing in a direction of the first variable resistive material layer from the semiconductor layer, and
the second variable resistive material layer has the oxygen vacancy concentration decreasing in a direction of a center of the core region from the first variable resistive material layer.

11. The semiconductor device as claimed in claim 3, wherein the first variable resistive material layer and the second variable resistive material layer have different thicknesses.

12. The semiconductor device as claimed in claim 1, wherein:
the lower structure includes a lower base, a peripheral circuit region on the lower base, and an upper base on the peripheral circuit region,
the lower base is a semiconductor substrate,
the upper base includes at least one of polysilicon, a metal, or a metal silicide, and
the impurity region is on the upper base.

13. The semiconductor device as claimed in claim 1, further comprising:
a buffer layer between the semiconductor layer and the data storage structure; and
an interfacial layer between the semiconductor layer and the buffer layer,
wherein the buffer layer has a thickness less than a thickness of the semiconductor layer,
wherein the semiconductor layer includes a first silicon,
wherein the buffer includes a second silicon having a grain smaller than a grain of the first silicon,
wherein the interfacial layer is an oxide of the semiconductor layer formed by oxidizing a surface of the semiconductor layer opposing the core region, and
wherein a thickness of the interfacial layer is less than a thickness of the buffer layer.

14. The semiconductor device as claimed in claim 1, wherein:
each of the gate electrodes includes a first gate portion adjacent to the vertical structure and a second gate portion adjacent to the separation structures,
the first gate portion includes a doped polysilicon, and
the second gate portion includes at least one of a metal silicide, a metal nitride, and a metal.

15. The semiconductor device as claimed in claim 1, wherein:
the gate dielectric layer includes a first dielectric layer, a second dielectric layer, and a data storage layer between the first dielectric layer and the second dielectric layer, and
the data storage layer is an electric charge trapping layer.

16. The semiconductor device as claimed in claim 1, wherein:
the data storage structure includes a plurality of separation layers and a plurality of data storage layers alternately layered,
the plurality of data storage layers includes a first phase change material layer and a second phase change material layer,
the plurality of separation layers includes a first separation layer between the first phase change material layer and the semiconductor layer, and a second separation layer between the first phase change material layer and the second phase change material layer,
a thickness of each of the first phase change material layer and the second phase change material layer is greater than a thickness of each of the first separation layer and the second separation layer,
the first phase change material layer and the second phase change material layer include a first element in common,
a concentration of the first element in the second phase change material layer is higher than a concentration of the first element in the first phase change material layer, and
the first element is Sb or Te.

17. The semiconductor device as claimed in claim 1, further comprising a barrier layer between the pad pattern and the data storage structure, the barrier layer including an insulating material.

18. The semiconductor device as claimed in claim 1, further comprising an undoped polysilicon between the pad pattern and the data storage structure, the pad pattern including a doped polysilicon.

* * * * *